(12) United States Patent
Hopkins et al.

(10) Patent No.: US 11,056,505 B2
(45) Date of Patent: Jul. 6, 2021

(54) INTEGRATED ASSEMBLIES HAVING ONE OR MORE MODIFYING SUBSTANCES DISTRIBUTED WITHIN SEMICONDUCTOR MATERIAL, AND METHODS OF FORMING INTEGRATED ASSEMBLIES

(71) Applicant: Micron Technology, Inc., Boise, ID (US)

(72) Inventors: John D. Hopkins, Meridian, ID (US); Purnima Narayanan, Boise, ID (US); Jordan D. Greenlee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/708,673

(22) Filed: Dec. 10, 2019

(65) Prior Publication Data
US 2021/0175249 A1    Jun. 10, 2021

(51) Int. Cl.
*H01L 27/115* (2017.01)
*H01L 27/11582* (2017.01)
(Continued)

(52) U.S. Cl.
CPC ... *H01L 27/11582* (2013.01); *H01L 21/31111* (2013.01); *H01L 21/3215* (2013.01); *H01L 21/76802* (2013.01); *H01L 21/76856* (2013.01); *H01L 21/76859* (2013.01); *H01L 21/76877* (2013.01); *H01L 23/5226* (2013.01); *H01L 27/1157* (2013.01); *H01L 27/11524* (2013.01); *H01L 27/11556* (2013.01); *H01L 21/76814* (2013.01); *H01L 21/76858* (2013.01); *H01L 21/76883* (2013.01); *H01L 27/0688* (2013.01); *H01L 27/11578* (2013.01)

(58) Field of Classification Search
CPC .......... H01L 27/11578; H01L 27/0688; H01L 21/76814; H01L 21/76858; H01L 21/76883

See application file for complete search history.

(56) References Cited

U.S. PATENT DOCUMENTS 6,162,737 A    12/2000 Weimer et al.
10,256,252 B1 *  4/2019 Kanazawa ........ H01L 21/02164
(Continued)

OTHER PUBLICATIONS

U.S. Appl. No. 15/931,421, filed May 13, 2020 by Wang.

*Primary Examiner* — George R Fourson, III
(74) *Attorney, Agent, or Firm* — Wells St. John P.S.

(57) ABSTRACT

Some embodiments include a method of forming an integrated assembly. A stack of alternating first and second materials is formed over a conductive structure. The conductive structure includes a semiconductor-containing material over a metal-containing material. An opening is formed to extend through the stack and through the semiconductor-containing material, to expose the metal-containing material. The semiconductor-containing material is doped with carbon and/or with one or more metals. After the doping of the semiconductor-containing material, the second material of the stack is removed to form voids. Conductive material is formed within the voids. Insulative material is formed within the opening. Some embodiments include integrated assemblies having carbon distributed within at least a portion of a semiconductor material.

39 Claims, 50 Drawing Sheets

(51) Int. Cl.
*H01L 27/11524* (2017.01)
*H01L 27/11556* (2017.01)
*H01L 27/1157* (2017.01)
*H01L 23/522* (2006.01)
*H01L 21/768* (2006.01)
*H01L 21/3215* (2006.01)
*H01L 21/311* (2006.01)
H01L 27/11578 (2017.01)
H01L 27/06 (2006.01)

(56) References Cited

U.S. PATENT DOCUMENTS

| | | | |
|---|---|---|---|
| 10,522,562 B2* | 12/2019 | Kim | H01L 27/11582 |
| 10,770,476 B1* | 9/2020 | Chung | H01L 27/11565 |
| 2015/0279857 A1* | 10/2015 | Kim | H01L 27/11582 |
| | | | 438/269 |
| 2016/0043093 A1* | 2/2016 | Lee | H01L 29/40114 |
| | | | 257/314 |
| 2017/0373089 A1* | 12/2017 | Kim | H01L 27/11582 |
| 2021/0005455 A1 | 1/2021 | Wang et al. | |

\* cited by examiner

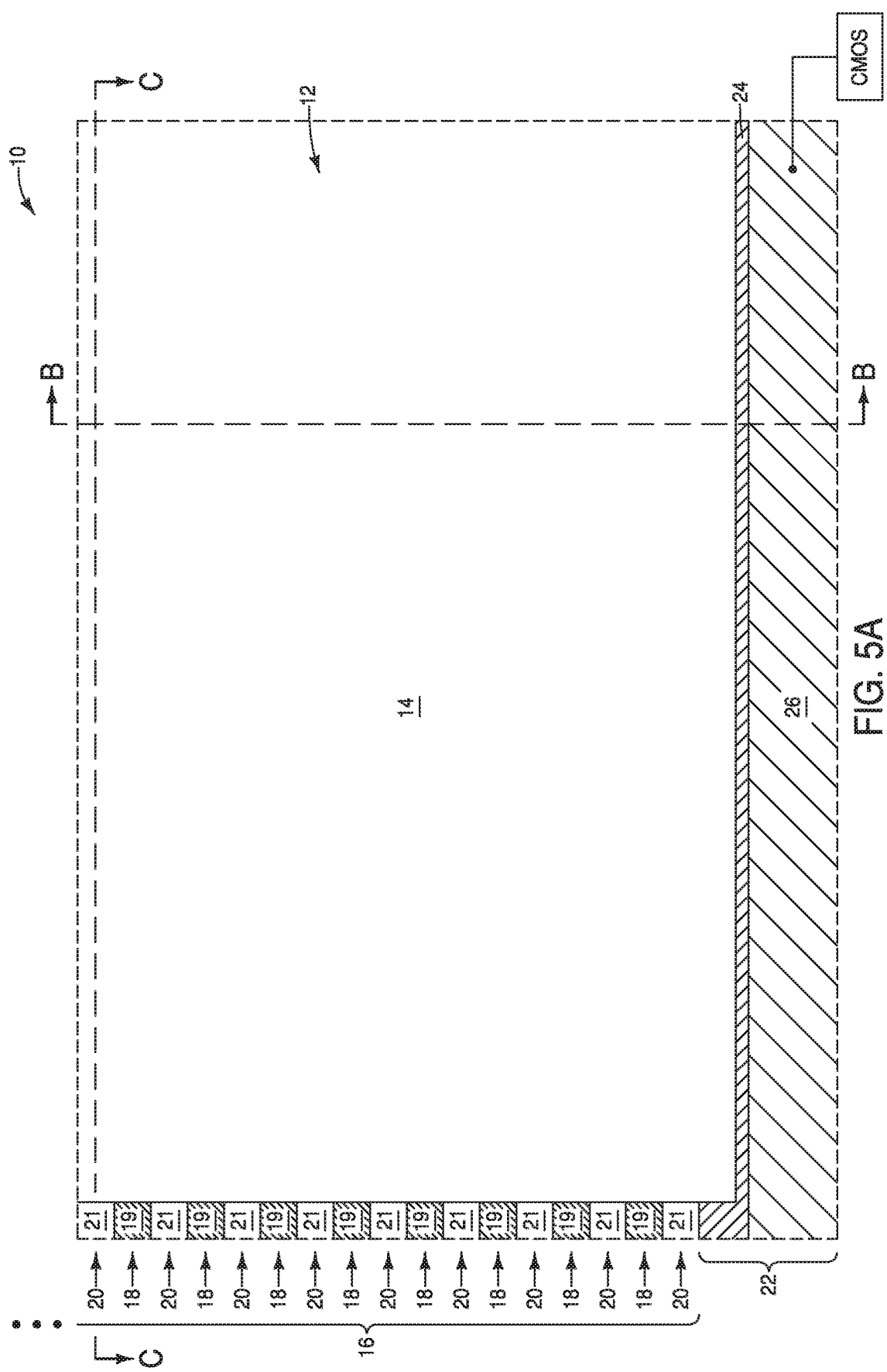

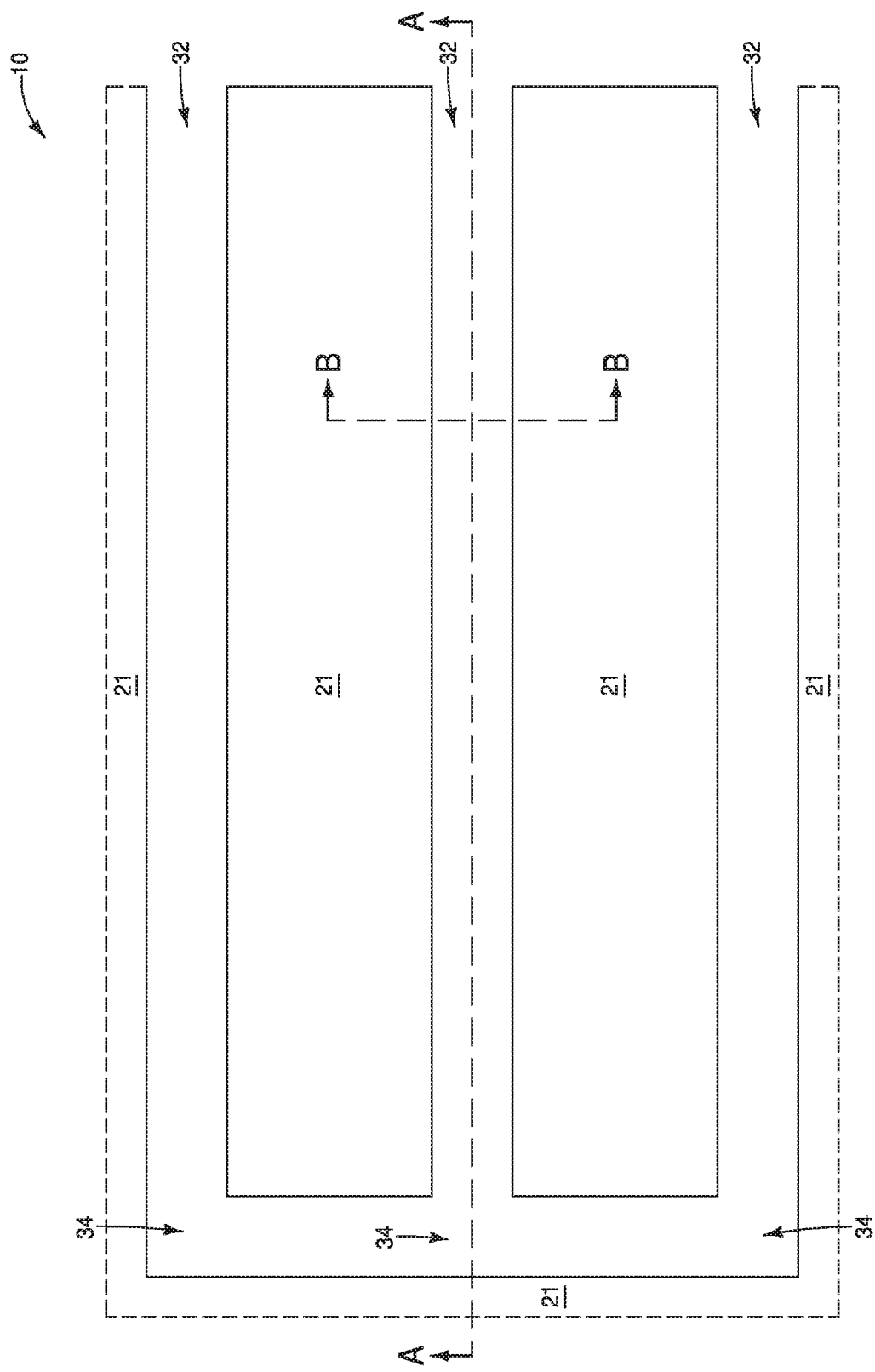

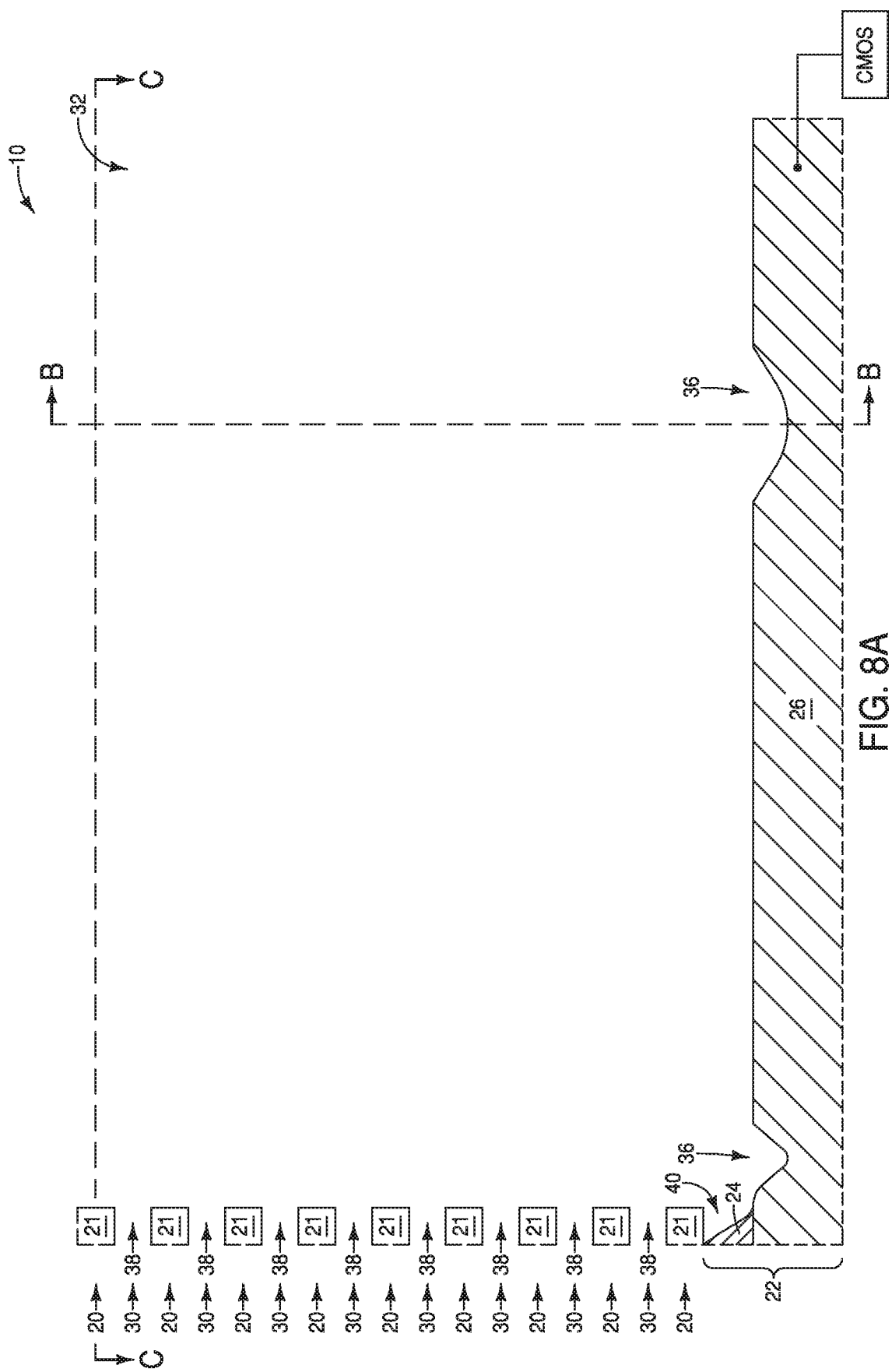

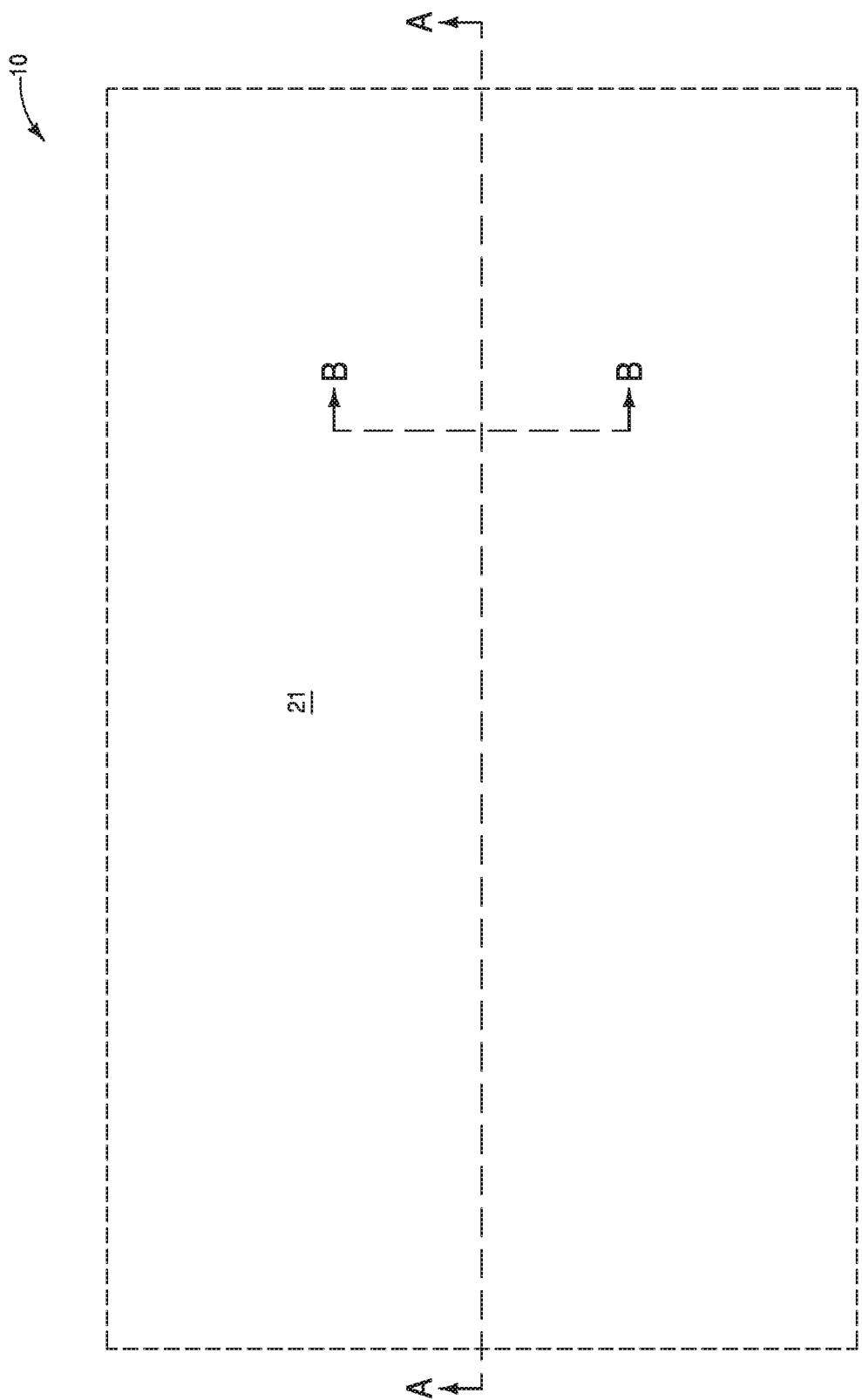

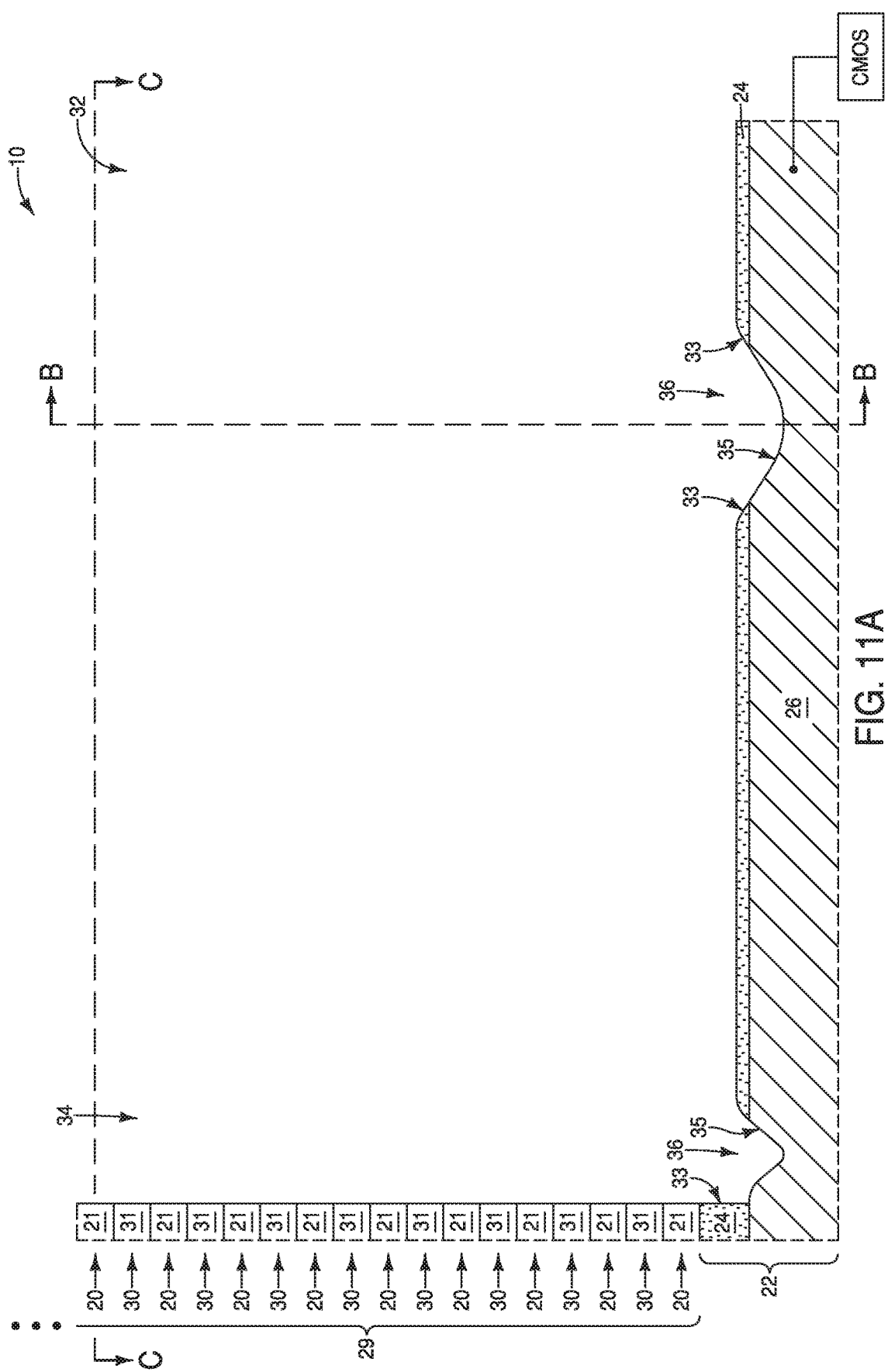

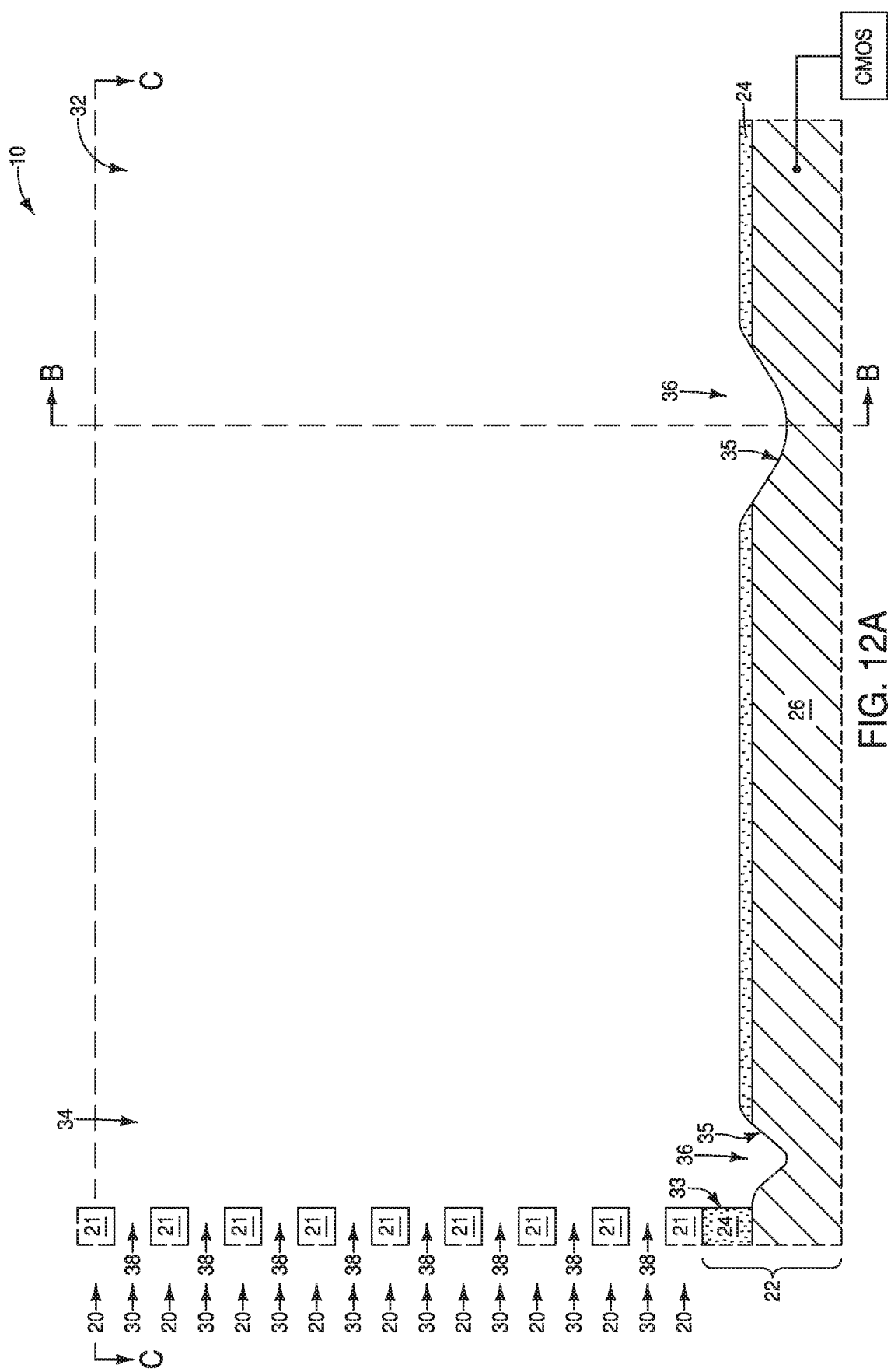

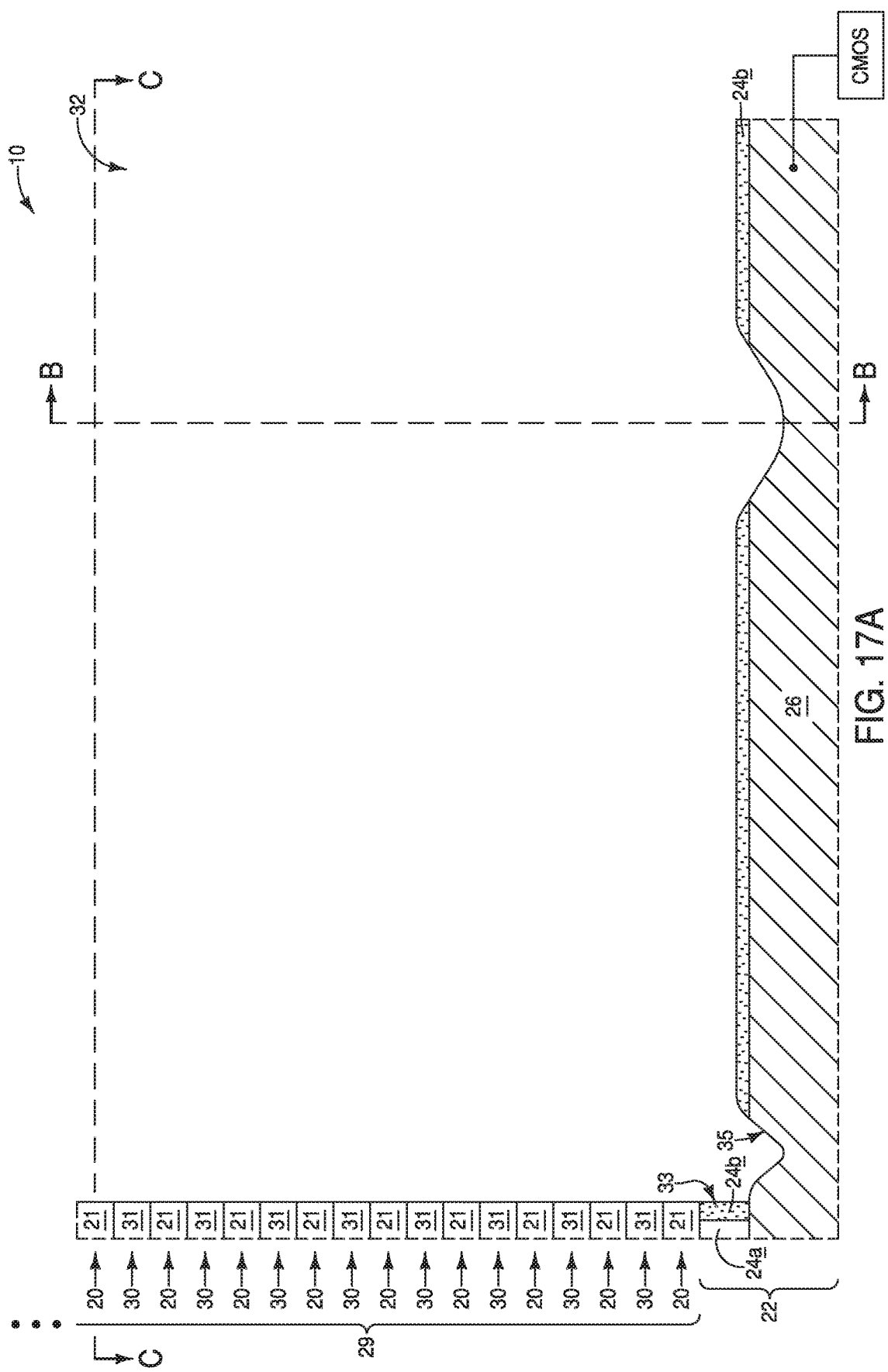

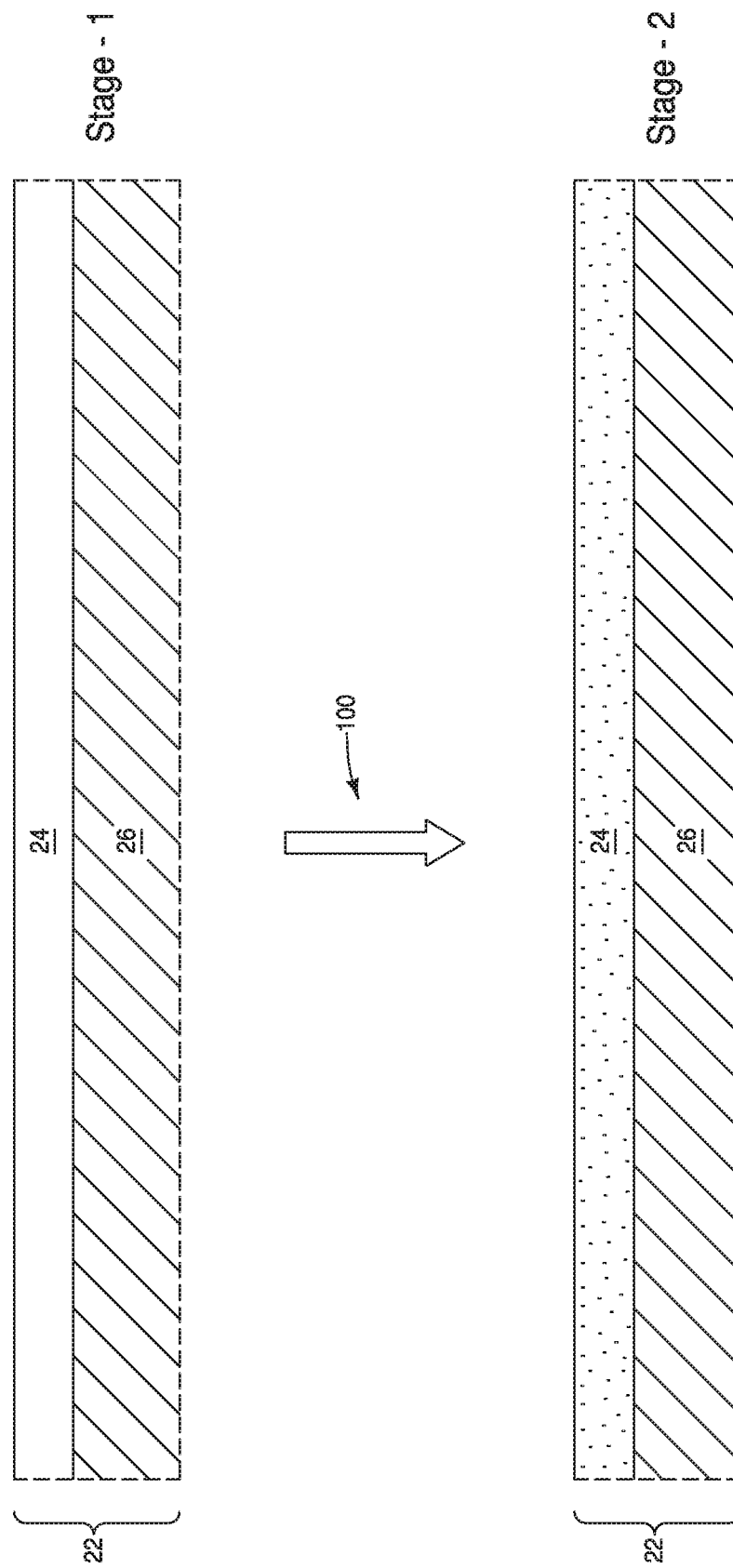

US 11,056,505 B2

INTEGRATED ASSEMBLIES HAVING ONE OR MORE MODIFYING SUBSTANCES DISTRIBUTED WITHIN SEMICONDUCTOR MATERIAL, AND METHODS OF FORMING INTEGRATED ASSEMBLIES

TECHNICAL FIELD

Integrated assemblies (e.g., three-dimensional NAND memory devices), and methods of forming integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a schematic diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1.024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_1$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line)

350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to develop improved NAND architecture and improved methods for fabricating NAND architecture.

BRIEF DESCRIPTION OF THE DRAWINGS

FIG. 5 is a diagrammatic top-down cross-sectional view along the lines C-C of FIGS. 5A and 5B. FIGS. 5A and 5B are diagrammatic cross-sectional side views along the lines A-A and B-B, respectively, of FIG. 5. The cross-sectional view of FIG. 5A is also along the line A-A of FIG. 5B, and the cross-sectional view of FIG. 5B is also along the line B-B of FIG. 5A.

FIG. 6 is a diagrammatic top-down cross-sectional view along the lines C-C of FIGS. 6A and 6B. FIGS. 6A and 6B are diagrammatic cross-sectional side views along the lines A-A and B-B, respectively, of FIG. 6. The cross-sectional view of FIG. 6A is also along the line A-A of FIG. 6B, and the cross-sectional view of FIG. 6B is also along the line B-B of FIG. 6A.

FIGS. 7-7B are views of the region of the integrated assembly of FIG. 6 at an example process stage subsequent to the process stage of FIG. 6. FIG. 7 is a diagrammatic top-down cross-sectional view along the lines C-C of FIGS. 7A and 7B. FIGS. 7A and 7B are diagrammatic cross-sectional side views along the lines A-A and B-B, respectively, of FIG. 7. The cross-sectional view of FIG. 7A is also along the line A-A of FIG. 7B, and the cross-sectional view of FIG. 7B is also along the line B-B of FIG. 7A.

FIG. 8 is a diagrammatic top-down cross-sectional view along the lines C-C of FIGS. 8A and 8B. FIGS. 8A and 8B are diagrammatic cross-sectional side views along the lines A-A and B-B, respectively, of FIG. 8. The cross-sectional view of FIG. 8A is also along the line A-A of FIG. 8B, and the cross-sectional view of FIG. 8B is also along the line B-B of FIG. 8A.

FIG. 9 is a diagrammatic top-down cross-sectional view along the lines C-C of FIGS. 9A and 9B. FIGS. 9A and 9B are diagrammatic cross-sectional side views along the lines A-A and B-B, respectively, of FIG. 9. The cross-sectional view of FIG. 9A is also along the line A-A of FIG. 9B, and the cross-sectional view of FIG. 9B is also along the line B-B of FIG. 9A.

FIGS. 10-10B are views of a region of an integrated assembly at an example process stage of an example method of fabricating an example memory device. FIG. 10 is a diagrammatic top-down cross-sectional view along the lines C-C of FIGS. 10A and 10B. FIGS. 10A and 10B are diagrammatic cross-sectional side views along the lines A-A and B-B, respectively, of FIG. 10. The cross-sectional view of FIG. 10A is also along the line A-A of FIG. 10B, and the cross-sectional view of FIG. 10B is also along the line B-B of FIG. 10A.

FIG. 11 is a diagrammatic top-down cross-sectional view along the lines C-C of FIGS. 1A and 11B. FIGS. 11A and 11B are diagrammatic cross-sectional side views along the lines A-A and B-B, respectively, of FIG. 11. The cross-sectional view of FIG. 11A is also along the line A-A of FIG. 11B, and the cross-sectional view of FIG. 11B is also along the line B-B of FIG. 11A.

FIG. 12 is a diagrammatic top-down cross-sectional view along the lines C-C of FIGS. 12A and 12B. FIGS. 12A and 12B are diagrammatic cross-sectional side views along the lines A-A and B-B, respectively, of FIG. 12. The cross-sectional view of FIG. 12A is also along the line A-A of FIG. 12B, and the cross-sectional view of FIG. 12B is also along the line B-B of FIG. 12A.

FIG. 13 is a diagrammatic top-down cross-sectional view along the lines C-C of FIGS. 13A and 13B. FIGS. 13A and 13B are diagrammatic cross-sectional side views along the lines A-A and B-B, respectively, of FIG. 13. The cross-sectional view of FIG. 13A is also along the line A-A of FIG. 13B, and the cross-sectional view of FIG. 13B is also along the line B-B of FIG. 13A.

FIG. 14 is a diagrammatic top-down cross-sectional view along the lines C-C of FIGS. 14A and 14B. FIGS. 14A and 14B are diagrammatic cross-sectional side views along the lines A-A and B-B, respectively, of FIG. 14. The cross-sectional view of FIG. 14A is also along the line A-A of FIG. 14B, and the cross-sectional view of FIG. 14B is also along the line B-B of FIG. 14A.

FIG. 15 is a diagrammatic top-down cross-sectional view along the lines C-C of FIGS. 15A and 15B. FIGS. 15A and 15B are diagrammatic cross-sectional side views along the lines A-A and B-B, respectively, of FIG. 15. The cross-sectional view of FIG. 15A is also along the line A-A of FIG. 15B, and the cross-sectional view of FIG. 15B is also along the line B-B of FIG. 10A.

FIG. 16 is a diagrammatic top-down cross-sectional view along the lines C-C of FIGS. 16A and 16B. FIGS. 16A and 16B are diagrammatic cross-sectional side views along the lines A-A and B-B, respectively, of FIG. 16. The cross-sectional view of FIG. 16A is also along the line A-A of FIG. 16B, and the cross-sectional view of FIG. 16B is also along the line B-B of FIG. 16A.

FIG. 17 is a diagrammatic top-down cross-sectional view along the lines C-C of FIGS. 17A and 17B. FIGS. 17A and 17B are diagrammatic cross-sectional side views along the lines A-A and B-B, respectively, of FIG. 17. The cross-sectional view of FIG. 17A is also along the line A-A of FIG. 17B, and the cross-sectional view of FIG. 17B is also along the line B-B of FIG. 17A.

FIG. 18 is a diagrammatic top-down cross-sectional view along the lines C-C of FIGS. 18A and 18B. FIGS. 18A and 18B are diagrammatic cross-sectional side views along the lines A-A and B-B, respectively, of FIG. 18. The cross-sectional view of FIG. 18A is also along the line A-A of FIG. 18B, and the cross-sectional view of FIG. 18B is also along the line B-B of FIG. 18A.

FIG. 19 is a diagrammatic top-down cross-sectional view along the lines C-C of FIGS. 19A and 19B. FIGS. 19A and 19B are diagrammatic cross-sectional side views along the lines A-A and B-B, respectively, of FIG. 19. The cross-sectional view of FIG. 19A is also along the line A-A of FIG. 19B, and the cross-sectional view of FIG. 19B is also along the line B-B of FIG. 19A.

FIG. 20 shows cross-sectional side views of a region of an assembly, and shows the region being subjected to ion implantation of dopant.

DETAILED DESCRIPTION OF THE ILLUSTRATED EMBODIMENTS

Some embodiments include recognition that a problem which may be encountered during fabrication of vertically-stacked memory (e.g., three-dimensional NAND) is unintended etching of supporting semiconductor material. Such may lead to problematic collapse of vertically-stacked structures, and may ultimately lead to device failure. Some embodiments include recognition that the problem may result from exposure of metal-containing conductive material under a region of the semiconductor material, followed by galvanic removal (corrosion) of the semiconductor material during subsequent processing. Some embodiments also include recognition that the problem may be alleviated by altering properties (e.g., chemical properties) of the semiconductor material to alleviate the problematic galvanic corrosion. Some embodiments include recognition that it may be advantageous to distribute modifying substances (e.g., carbon and/or metal) within regions of the semiconductor material exposed to conditions that otherwise lead to galvanic corrosion, and that such modifying substances may alter properties of the semiconductor material to alleviate, or even prevent, the problematic galvanic corrosion. Example embodiments are described with reference to FIGS. 5-20.

Figure 1:
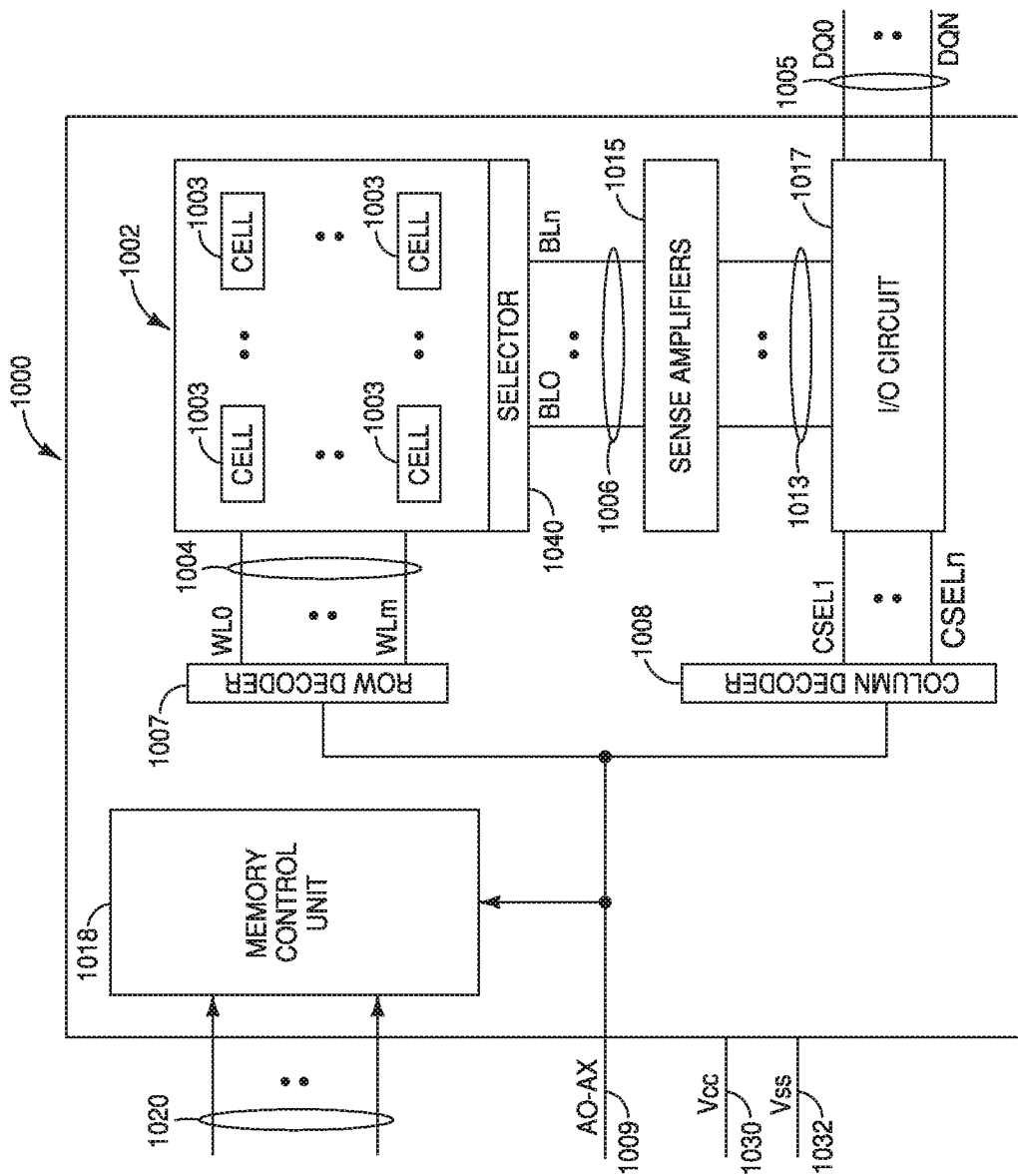
FIG. 1 shows a block diagram of a prior art memory device having a memory array with memory cells.
Figure 2:
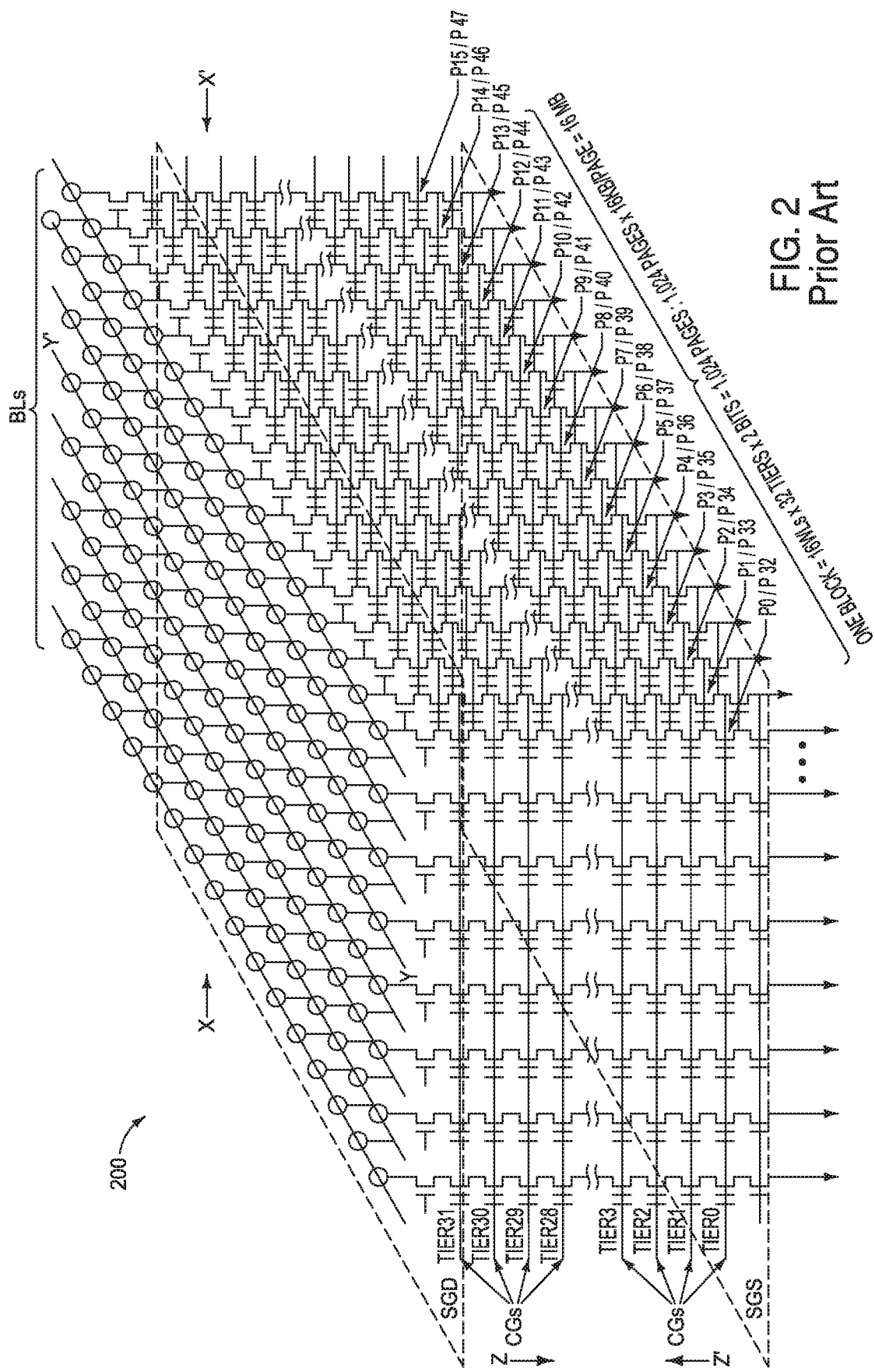
FIG. 2 shows a schematic diagram of the prior art memory array of FIG. 1 in the form of a 3D NAND memory device.
Figure 3:
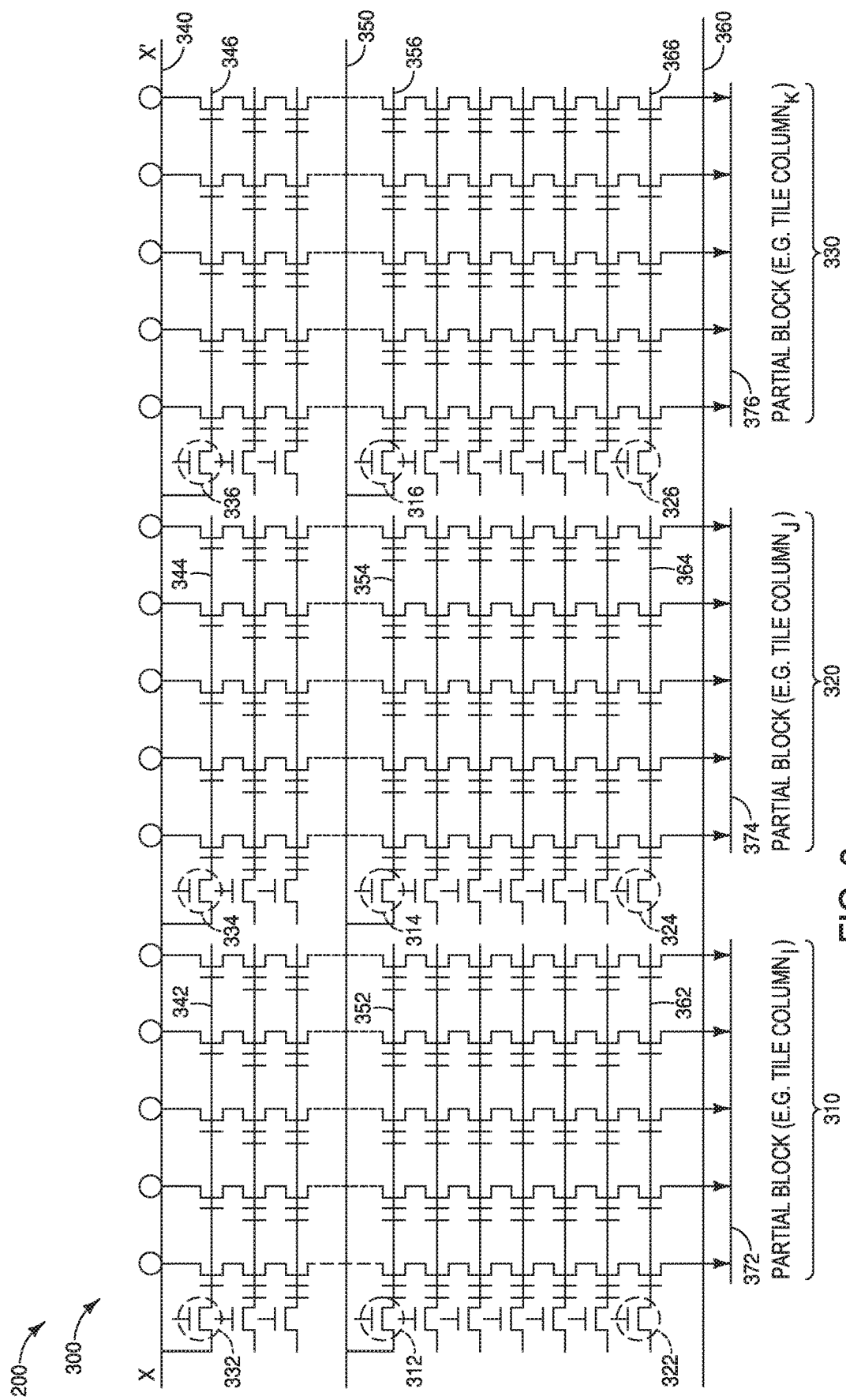
FIG. 3 shows a cross-sectional view of the prior art 3D NAND memory device of FIG. 2 in an X-X' direction.
Figure 4:
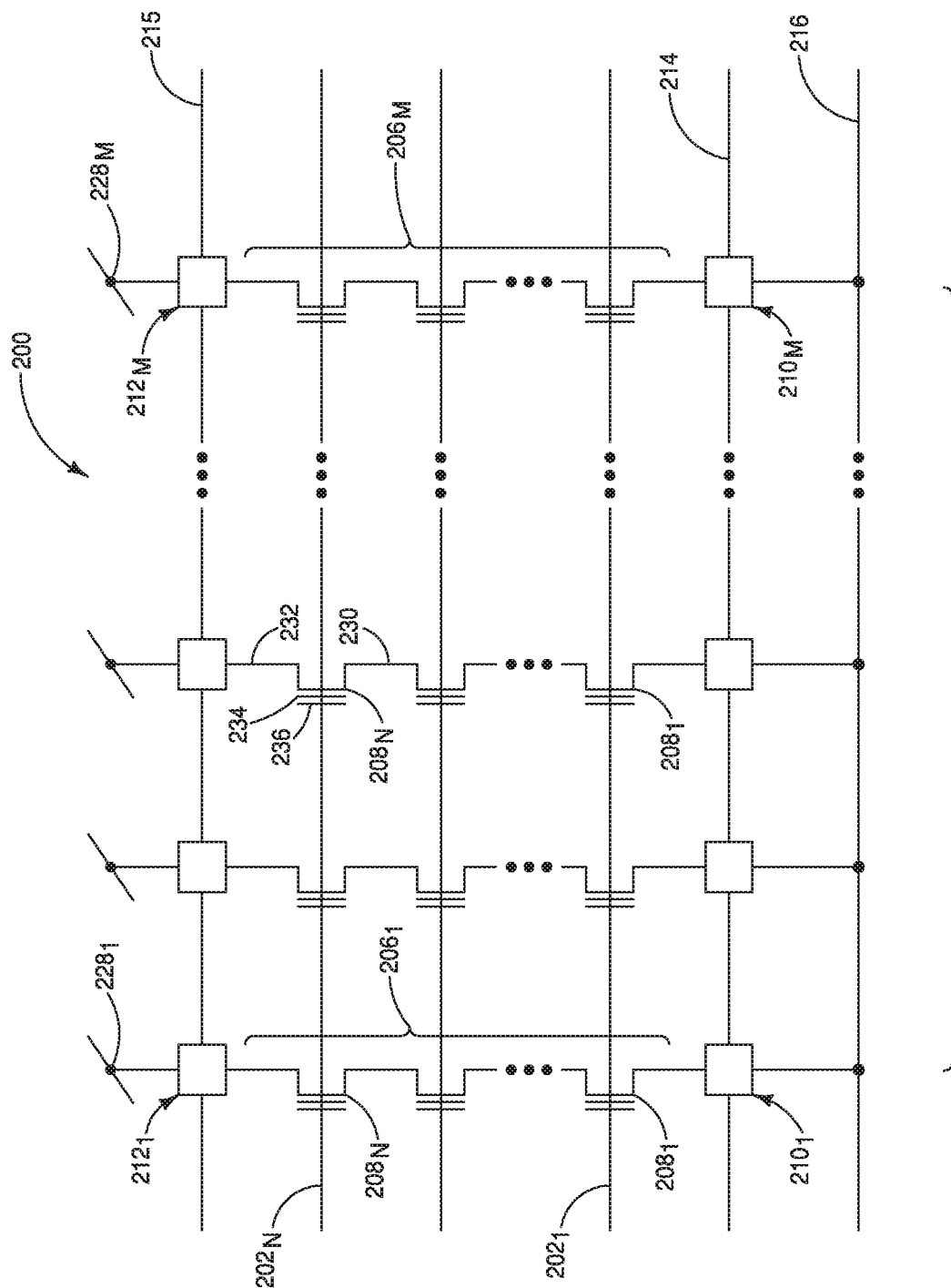
FIG. 4 is a schematic diagram of a prior art NAND memory array.
Figure 5:
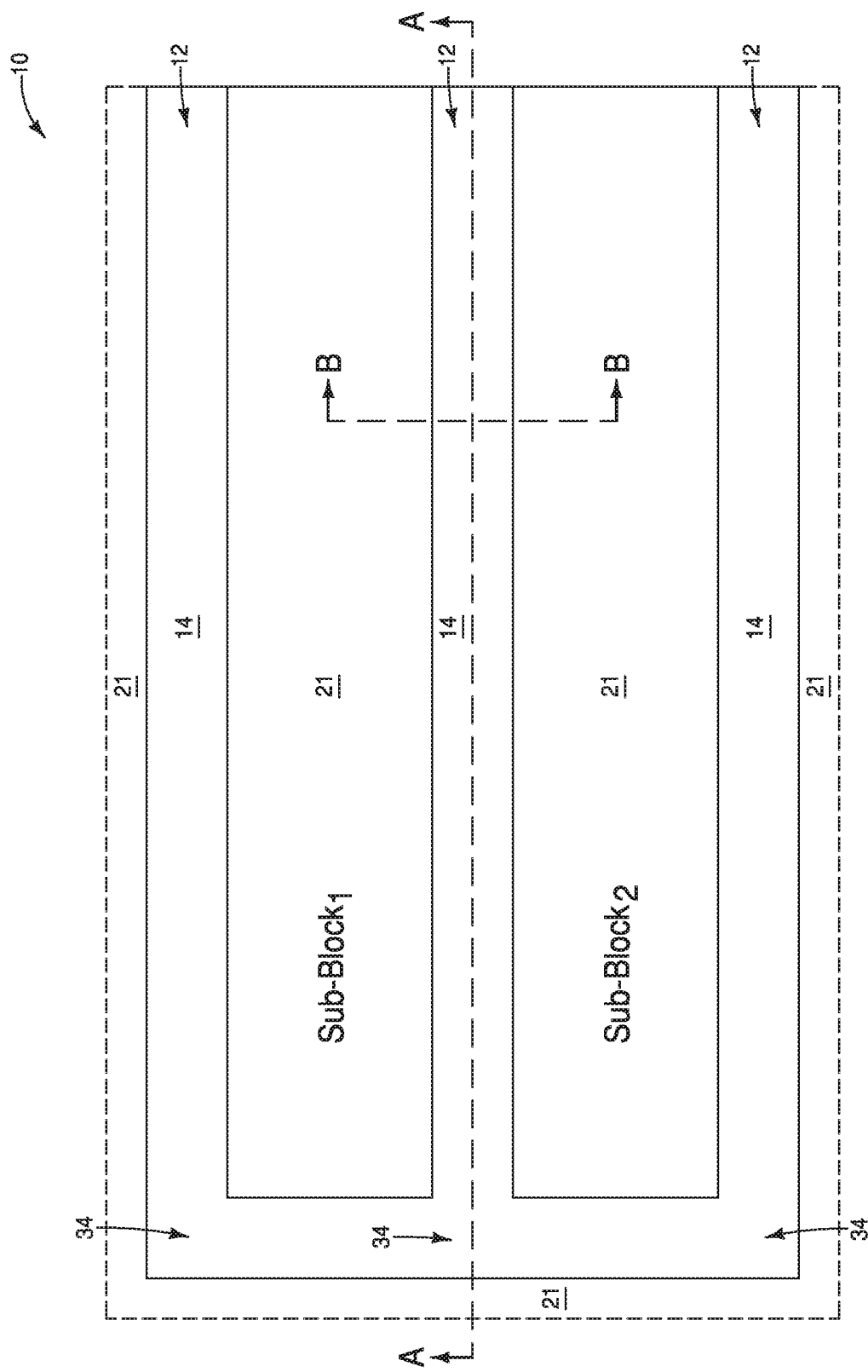
FIGS. 5-5B are views of a region of an integrated assembly illustrating an example architecture.
Figure 5B:
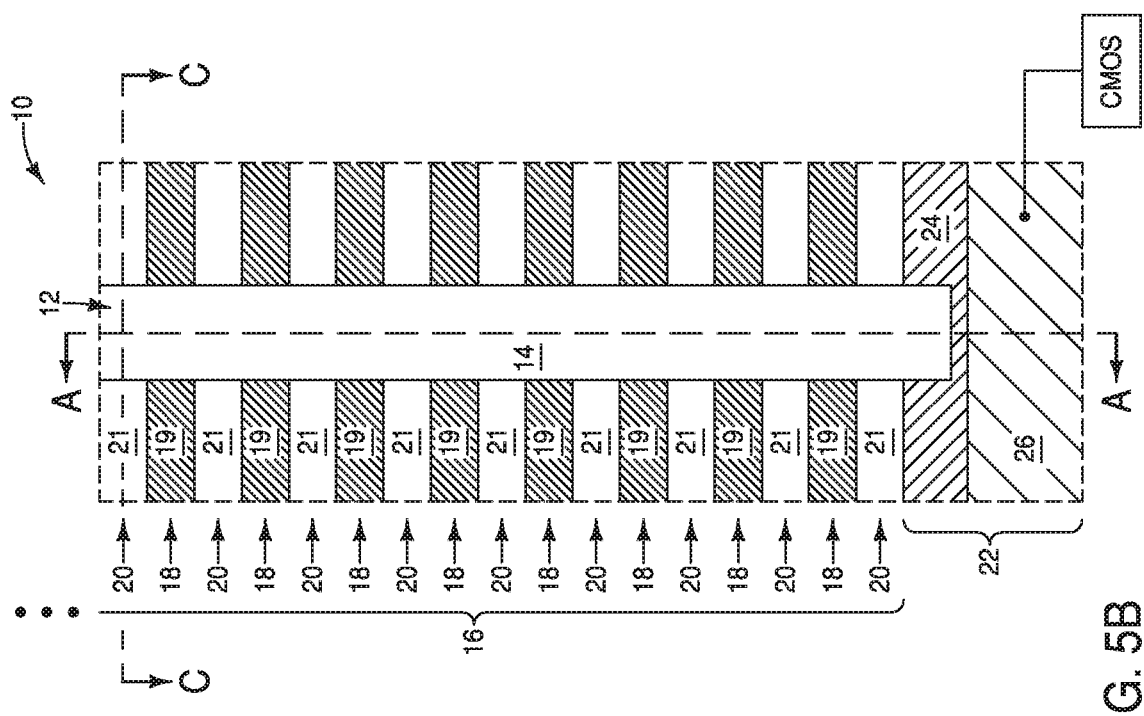

Referring to FIGS. 5-5B, regions of an example integrated assembly (memory device) 10 are illustrated. The assembly includes a block region which is subdivided amongst a pair of sub-blocks (labeled "Sub-block$_1$" and "Sub-block$_2$"). The sub-blocks may be arranged in configurations suitable for three-dimensional NAND architectures (NAND memory devices), such as, for example, architectures of the types described above in FIGS. 1-4.

A partition (panel) 12 extends around the sub-blocks, and separates the sub-blocks from one another. The partition 12 comprises a partition material 14. The partition material 14 may be an insulative material, and may comprise any suitable composition(s). In some embodiments, the partition material 14 may comprise, consist essentially of, or consist of silicon dioxide.

The cross-sectional views of FIGS. 5A and 5B show that the assembly 10 includes a stack 16 of alternating conductive levels 18 and insulative levels 20. The levels 18 comprise conductive material 19, and the levels 20 comprise insulative material 21.

The conductive material 19 may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 19 may include metal (e.g., tungsten) and metal nitride (e.g., tantalum nitride, titanium nitride, etc.).

The insulative material 21 may comprise any suitable composition(s); and in some embodiments may comprise, consist essentially of, or consist of silicon dioxide.

The levels 18 and 20 may be of any suitable thicknesses; and may be the same thickness as one another or different thicknesses relative to one another. In some embodiments, the levels 18 and 20 may have vertical thicknesses within a range of from about 10 nanometers (nm) to about 400 nm.

In some embodiments, the lower conductive level may be representative of a source-select-device (e.g., source-side select gate, SGS); and the upper conductive levels may be representative of wordline levels (control gate levels). The source-select-device level may or may not comprise the same conductive material(s) as the wordline levels.

Although only eight conductive levels 18 are shown in FIGS. 5A and 5B in order to simplify the drawings, in practice there may be substantially more than eight conductive levels in the stack 16 (or fewer than eight conductive levels in the stack). In some applications, the wordline levels may ultimately correspond to memory cell levels of a NAND memory configuration (NAND assembly, NAND memory device). The NAND memory configuration will include strings of memory cells (i.e., NAND strings), with the number of memory cells in the strings being determined by the number of vertically-stacked wordline levels. The NAND strings may comprise any suitable number of memory cell levels. For instance, the NAND strings may have 8 memory cell levels, 16 and memory cell levels, 32 memory cell levels, 64 memory cell levels, 512 memory cell levels, 1024 memory cell levels, etc. Also, the source-select-device may include more than one conductive level.

The stack 16 and partition 12 are supported over a conductive structure 22. Such conductive structure comprises a semiconductor-containing material 24 over a metal-containing material 26. In the illustrated embodiment, the semiconductor-containing material 24 is directly against the metal-containing material 26.

The semiconductor-containing material 24 may comprise any suitable composition(s); and in some embodiments may comprise, consist essentially of, or consist of one or more of silicon, germanium, III/V semiconductor material (e.g., gallium phosphide), semiconductor oxide, etc.; with the term II/V semiconductor material referring to semiconductor materials comprising elements selected from groups III and V of the periodic table (with groups III and V being old nomenclature, and now being referred to as groups 13 and 15). In some embodiments, the semiconductor-containing material 24 may comprise, consist essentially of, or consist of conductively-doped silicon; such as, for example, n-type doped polysilicon. In some embodiments, the semiconductor-containing material 24 may comprise, consist essentially of, or consist of conductively-doped germanium. In some embodiments, the semiconductor-containing material 24 may comprise, consist essentially of, or consist of conductively-doped Si/Ge, where Si/Ge means a combination of silicon and germanium. The ratio of silicon to germanium within such combination may be any suitable ratio, and in some embodiments may be within a range of from about 1:99 to about 99:1.

The metal-containing material 26 may comprise any suitable composition(s), such as, for example, one or more of various metals (e.g., titanium, tungsten, cobalt, nickel, platinum, ruthenium, etc.) and/or metal-containing compositions (e.g., metal silicide, metal nitride, metal carbide, etc.). In some embodiments, the metal-containing material 26 may comprise, consist essentially of, or consist of $WSi_x$, where x is greater than 0. In some embodiments, the metal-containing material 26 may comprise one or more of titanium, tungsten, cobalt, nickel and molybdenum. In some embodiments, the metal-containing material 26 may comprise one or more of metal silicide, metal germanide, metal carbide, metal nitride, metal oxide and metal boride.

In some embodiments, the conductive structure 22 may correspond to a source structure (e.g., a structure comprising the so-called common source line 216 of FIG. 4). The source structures of FIGS. 1-4 are referred to as "lines" in accordance with traditional nomenclature, but such lines may be comprised by an expanse rather than a simple wiring line; such as the expanse shown in FIGS. 5A and 5B as structure 22.

Vertically-stacked memory cells (not shown in FIGS. 5-5B) may be provided within the stack 16 along the conductive wordline levels. Such memory cells may be arranged in vertical NAND strings of the types described in FIGS. 1-4. The NAND strings may comprise channel material pillars which extend through the stack 16, with the channel material being electrically coupled with the semiconductor-containing material 24 of the conductive structure 22. The channel material pillars may be arranged within the sub-blocks in any suitable configuration; and in some embodiments may be in a tightly-packed arrangement, such as, for example, a hexagonally-packed arrangement.

The conductive structure 22 may be supported by a semiconductor substrate (not shown). The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The conductive structure 22 is shown to be electrically coupled with CMOS (complementary metal oxide semiconductor). The CMOS may be in any suitable location relative to the conductive structure 22, and in some embodiments may be under such conductive structure. The CMOS may comprise logic and/or other appropriate circuitry for driving the source structure 22 during operation of memory associated with the stack 16. Although the circuitry is specifically identified to be CMOS in the embodiment of FIGS. 5A and 5B, it is to be understood that at least some of such circuitry could be replaced with any other suitable circuitry in other embodiments.

FIGS. 5-5B show a desired arrangement in which the stack 16 is supported over the conductive structure 22. However, in practice it is sometimes found that the actual arrangement has a warped or broken stack. Specifically, processing utilized to form the conductive levels 18 may undesirably remove a substantial amount of the semiconductor-containing material 24 of conductive structure 22, leading to formation of voids between the stack 16 and the conductive material 26. The voids may cause partial and/or total collapse of some of the regions of the stack 16; which may detrimentally alter device performance, and which may even lead to device failure. One aspect of the invention described herein is recognition that the detrimental voids may result from galvanic corrosion of the semiconductor-containing material 24, as explained with reference to FIGS. 6-9.

Figure 6:
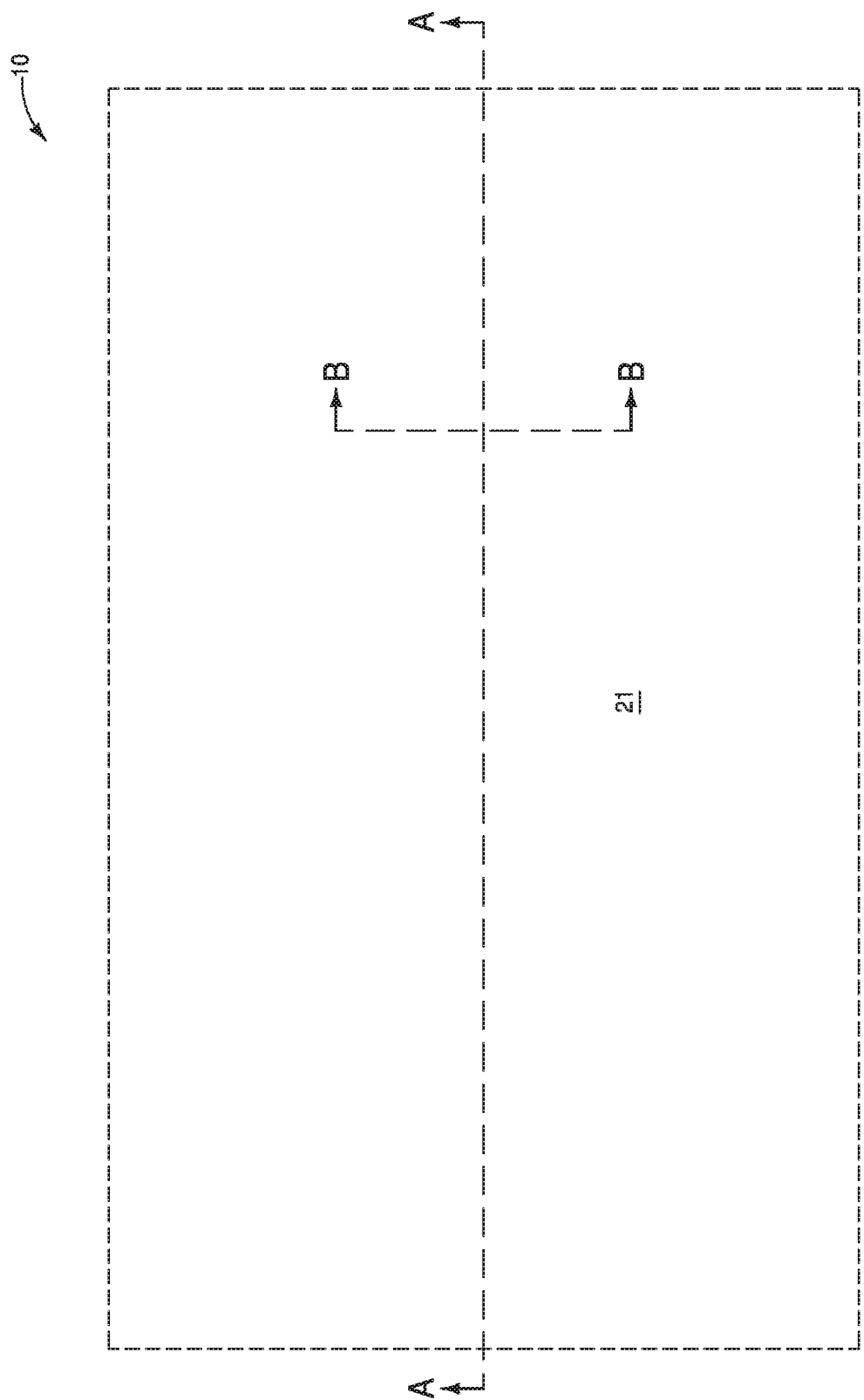
FIGS. 6-6B are views of a region of an integrated assembly at an example process stage of an example method for forming an example architecture.
Figure 6A:
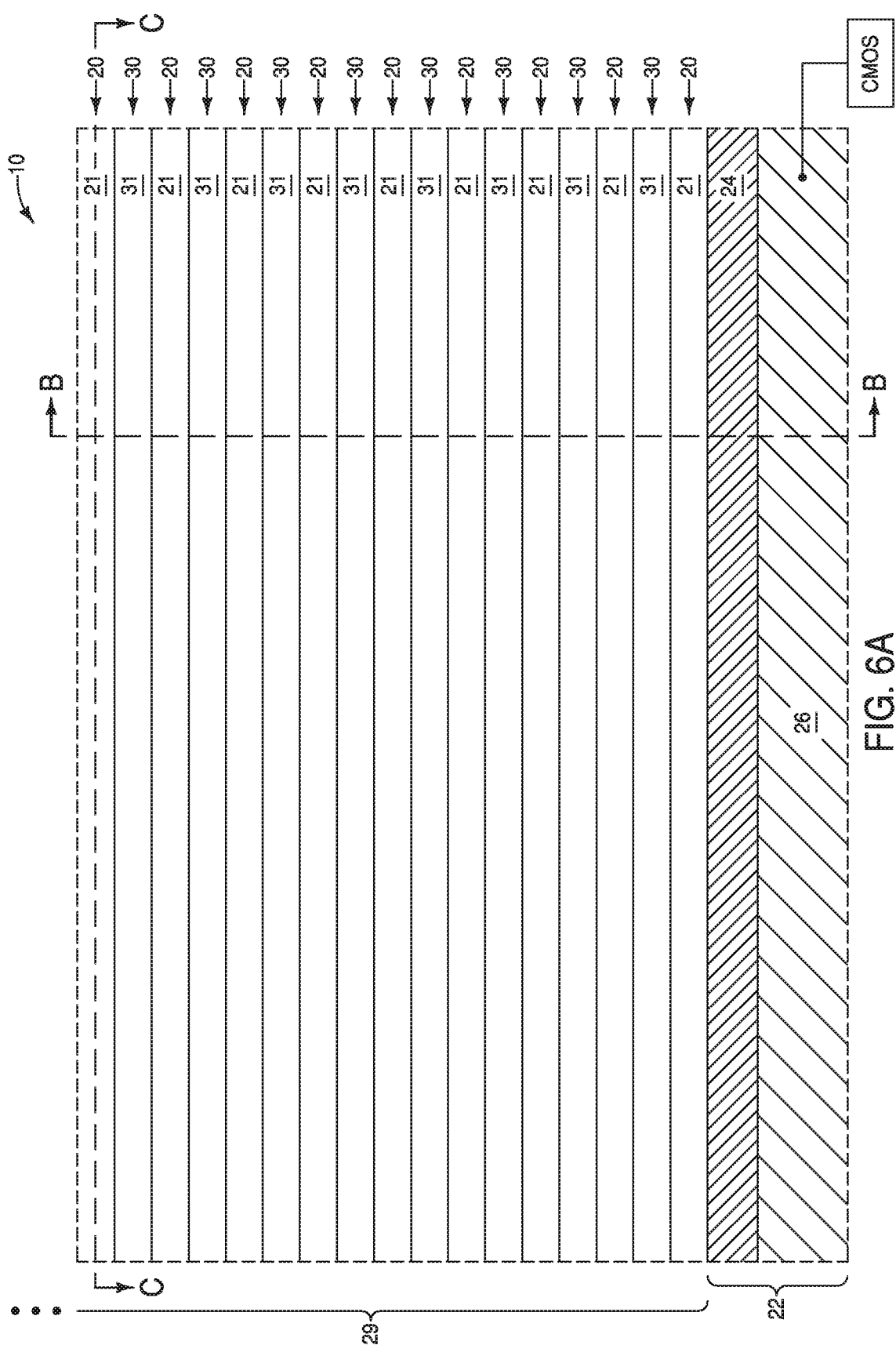
Figure 6B:
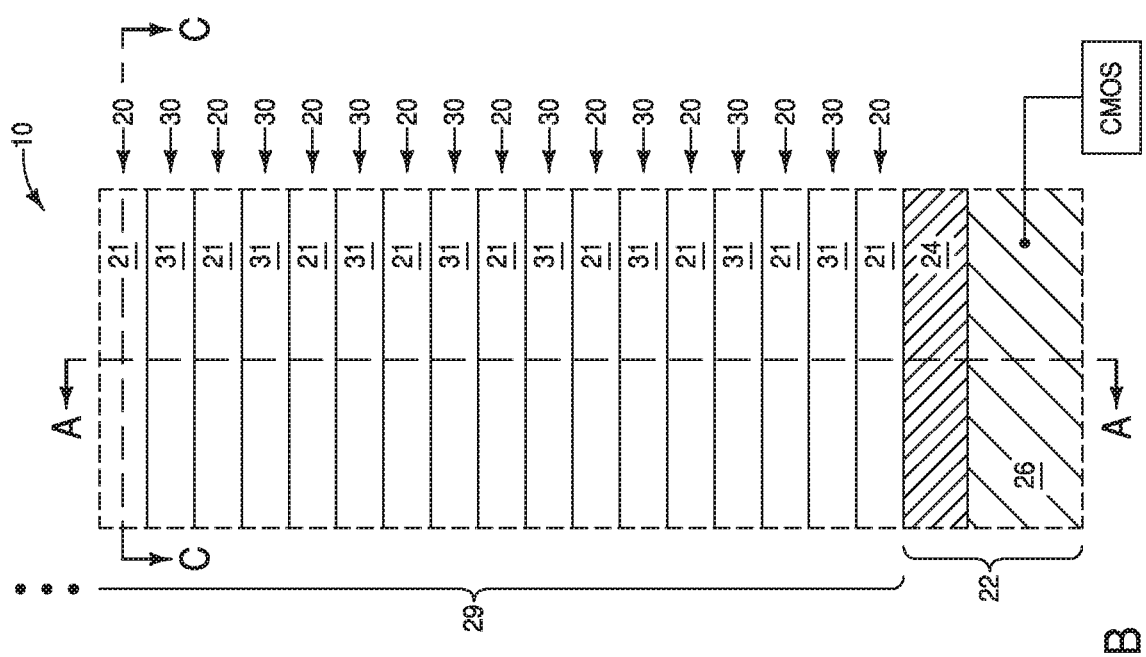

Referring to FIGS. 6-6B, a region of assembly 10 is shown at a process stage during fabrication of the conductive wordlines of stack 16 (with the conductive wordlines ultimately being within the conductive levels 18 described above with reference to FIG. 5). It was noted above in describing FIG. 5 that the upper conductive levels 18 may correspond to wordlines and the lower level(s) may correspond to one more select device levels. The processing described herein forms all of the levels 18 identically with a gate-replacement process. In other embodiments, the select device levels may not be subjected to the gate replacement processing.

The assembly 10 of FIGS. 6-6B includes a stack 29 of alternating levels 20 and 30. The levels 20 may be considered to be one set of levels, and the levels 30 may be considered to be another set of levels. One of the sets of the levels 20 and 30 may be referred to as first levels while the other set is referred to as second levels (e.g., the levels 20 may be referred to as first levels and the levels 30 may be referred to as second levels). The levels 20 are identical to the insulative levels 20 described above with reference to FIGS. 5-5B, and comprise the insulative material 21. The levels 30 comprise sacrificial material 31. Such sacrificial material may comprise any suitable composition(s); and in some embodiments may comprise, consist essentially of, or consist of silicon nitride. The materials 21 and 31 may be referred to as alternating first and second materials, respectively, of the stack 29; or alternatively may be referred to as alternating second and first materials, respectively, of the stack 29.

The stack 29 is supported over the conductive structure 22. In the illustrated embodiment, the conductive structure 22 is coupled with CMOS at the processing stage of FIGS. 6-6B. In other embodiments, the coupling to the CMOS may be provided at a subsequent process stage.

Figure 7A:
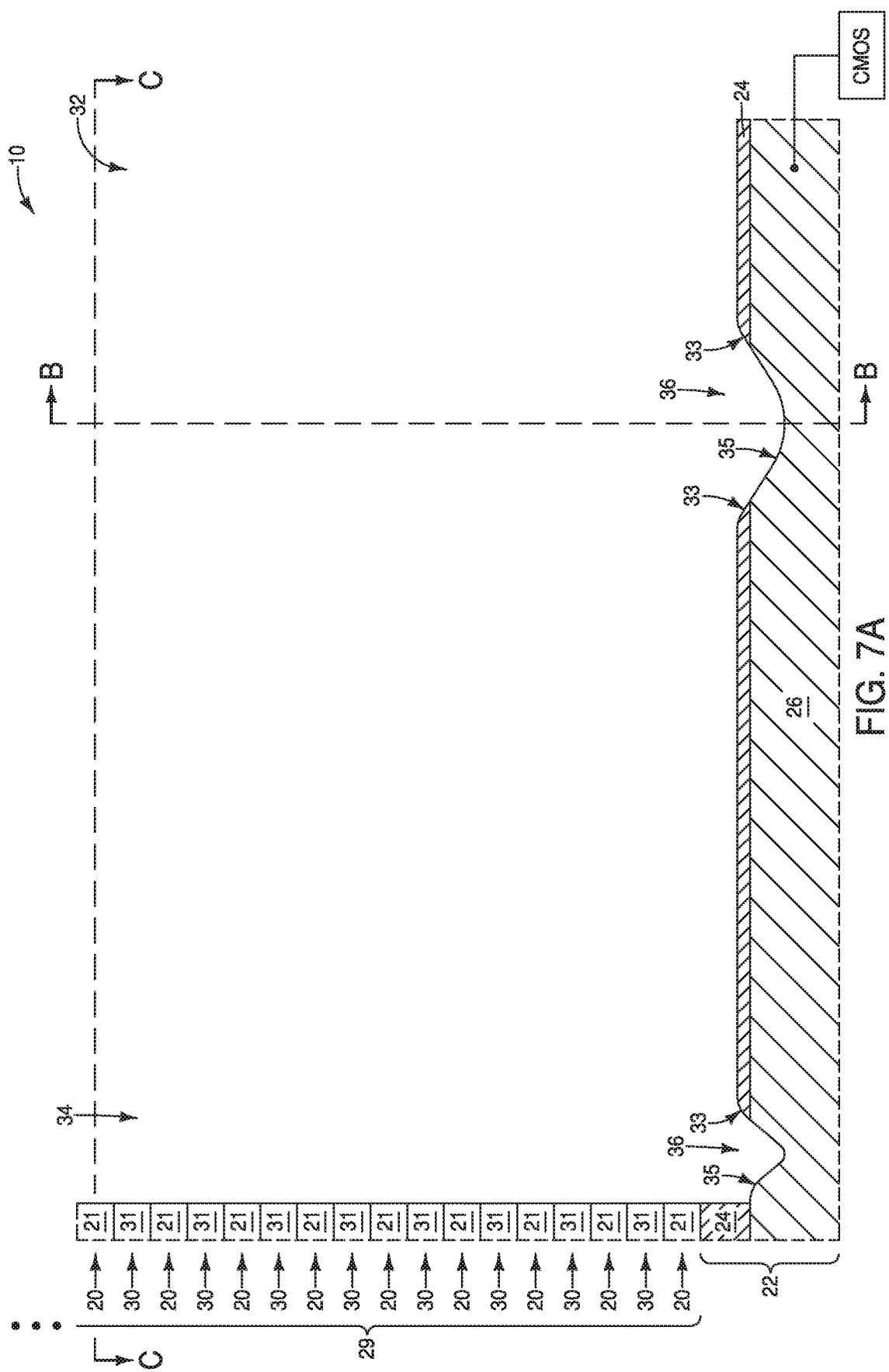
Figure 7B:
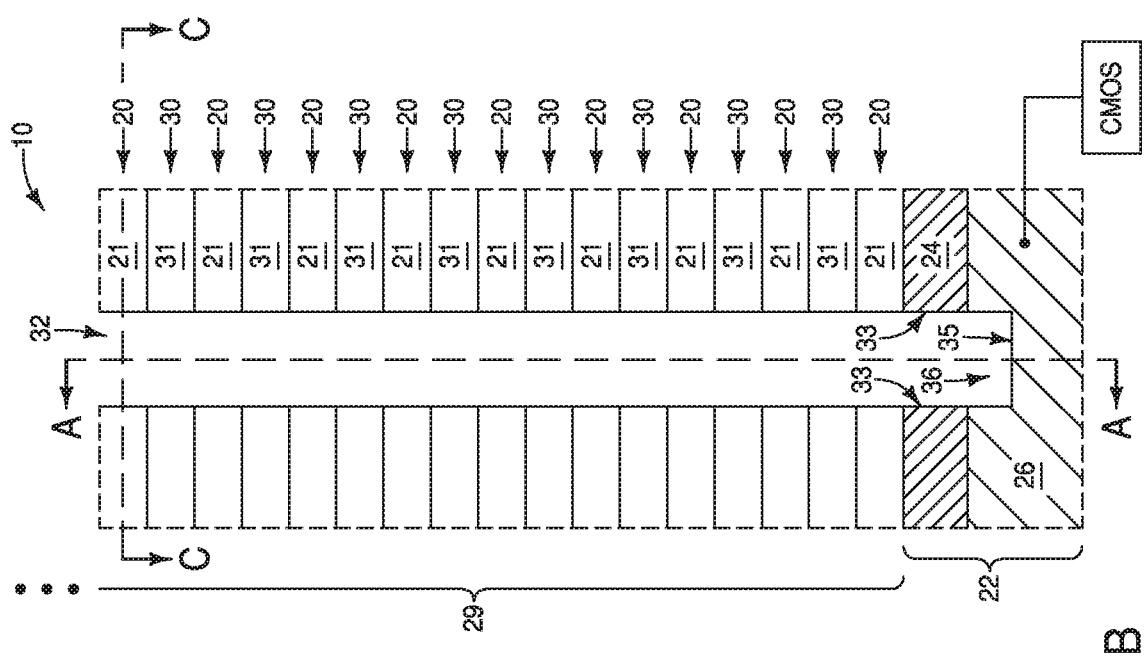

Referring to FIGS. 7-7B, trenches (slits, openings) 32 are formed through the stack 29 to the conductive structure 22. The slits 32 join to one another at intersect regions (T-regions) 34. The intersect regions are wider than other portions of the slits, and accordingly the etching utilized to form the slits may form cavities 36 in the semiconductor-containing material 24 at the intersect regions 34. At least one of the cavities 36 may extend through the semiconductor-containing material 24 to expose the metal-containing material 26 of the conductive structure 22. Additional cavities 36 may form at other locations besides the intersect regions, as shown in FIGS. 7A and 7B. Each of the illustrated cavities 36 may be considered to be a region of a trench 32 which passes through the semiconductor-containing material 24 and into the metal-containing material 26. In some embodiments, the cavities 36 may be considered to be bottom regions (or bottoms) of the trenches (or openings, slits, etc.,) 32; with such bottom regions being illustrated to have exposed surfaces (or exposed regions) 33 of the semiconductor-containing material 24 and exposed surfaces (or exposed regions) 35 of the metal-containing material 26.

Figure 8:
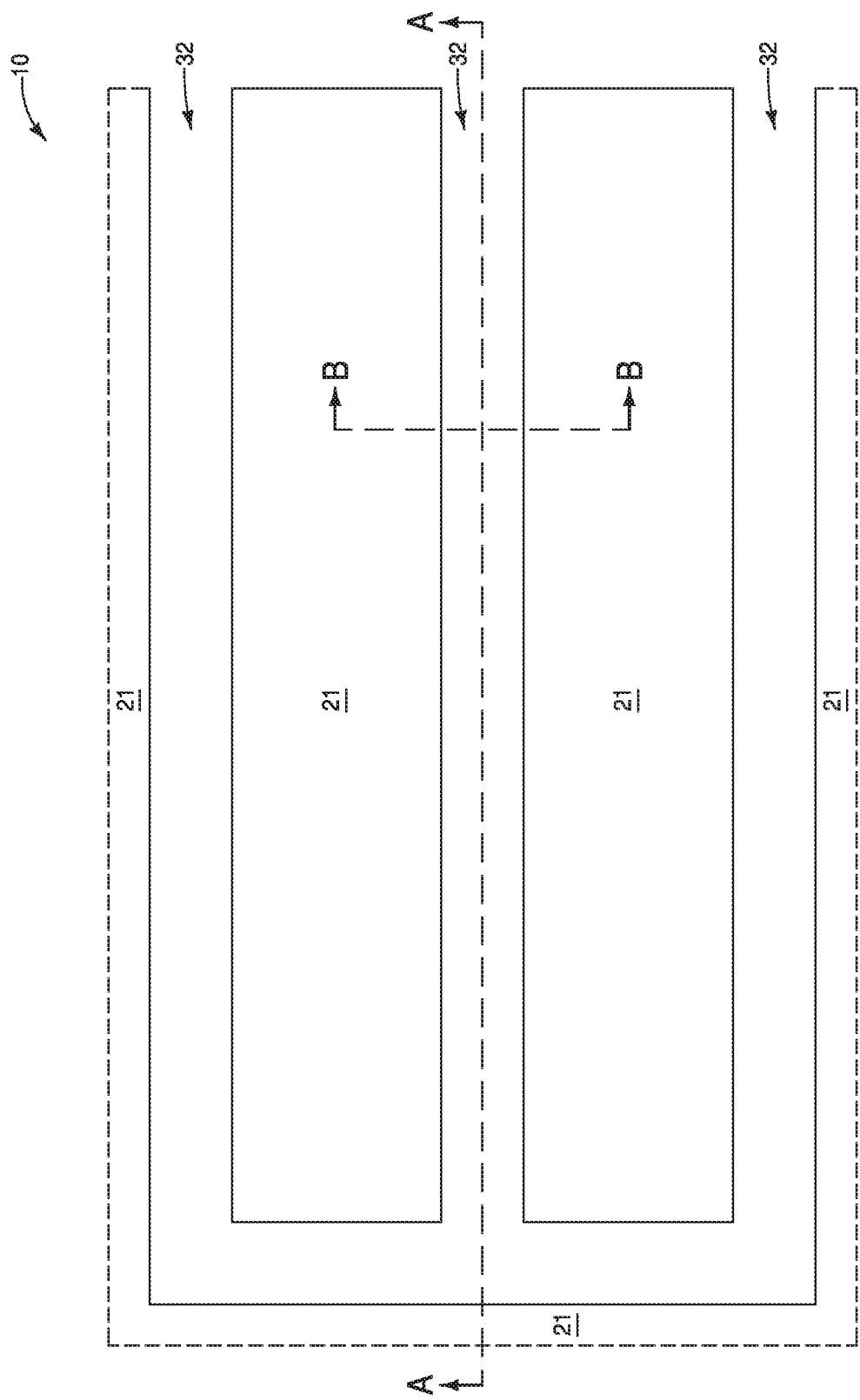
FIGS. 8-8B are views of the region of the integrated assembly of FIGS. 6-6B at an example process stage subsequent to the process stage of FIGS. 7-7B.
Figure 8B:
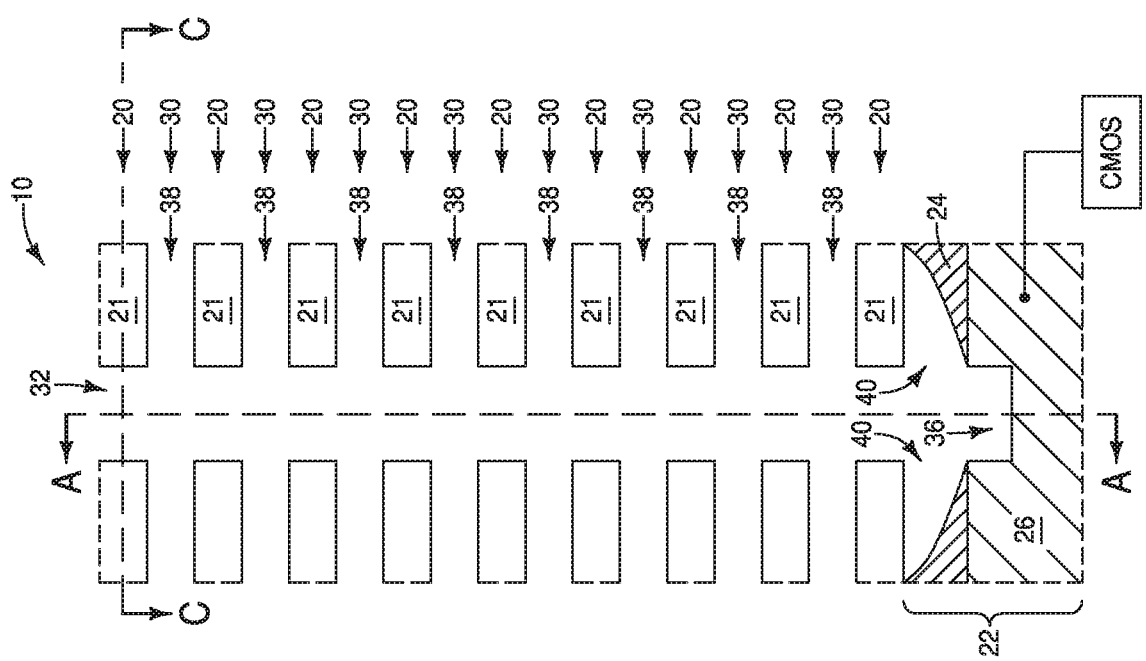

Referring to FIGS. 8-8B, the sacrificial material 31 (FIGS. 7-7B) is removed to form voids 38 along the levels 30. Such removal may utilize etching with hot phosphoric acid. The semiconductor-containing material 24 (e.g., conductively-doped silicon) would generally be resistant to the etching utilized to remove the sacrificial material 31. However, the exposure of conductive material 26 within the cavities 36 enables a galvanic reaction to occur (due to different oxidation potentials of the exposed materials 24 and 26) which undesirably removes some of the conductive material 24. The removal of the conductive material 24 leads to formation of voids (or cavities) 40 undercutting regions under the bottommost of the insulative levels 20.

The galvanic reaction is described as a possible mechanism for the undesired removal of regions of the semiconductor-containing material 24 to assist the reader in understanding the invention described herein. The actual mechanism behind the removal of the regions of the semiconductor-containing material 24 may involve other reactions in addition to, or alternatively to, the galvanic reaction described herein. The claims that follow are not to be limited to any specific reaction mechanism described herein except to the extent, if any, that such reaction mechanism is specifically recited in the claims.

Figure 9:
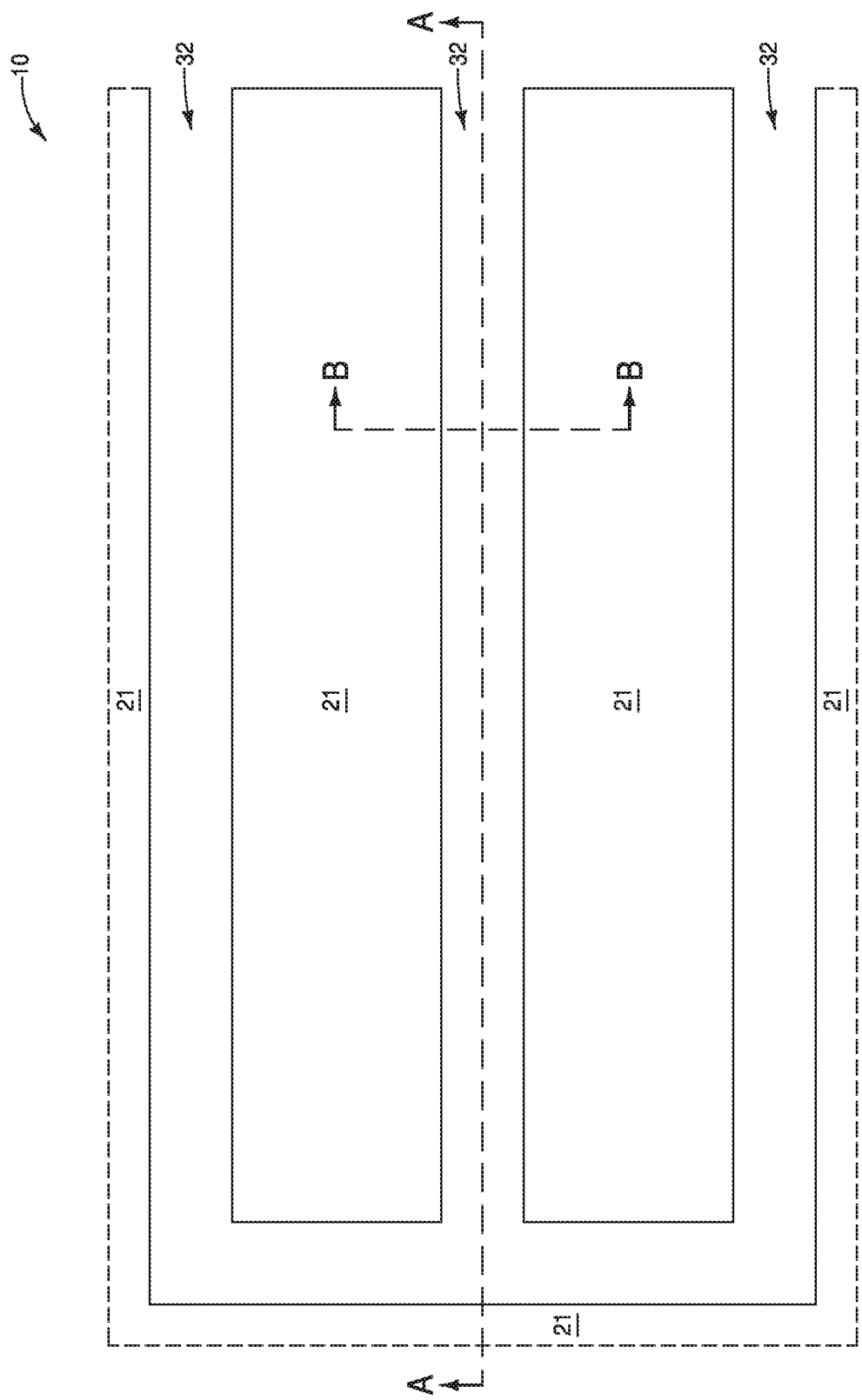
FIGS. 9-9B are views of the region of the integrated assembly of FIGS. 6-6B at an example process stage subsequent to the process stage of FIGS. 8-8B.
Figure 9A:
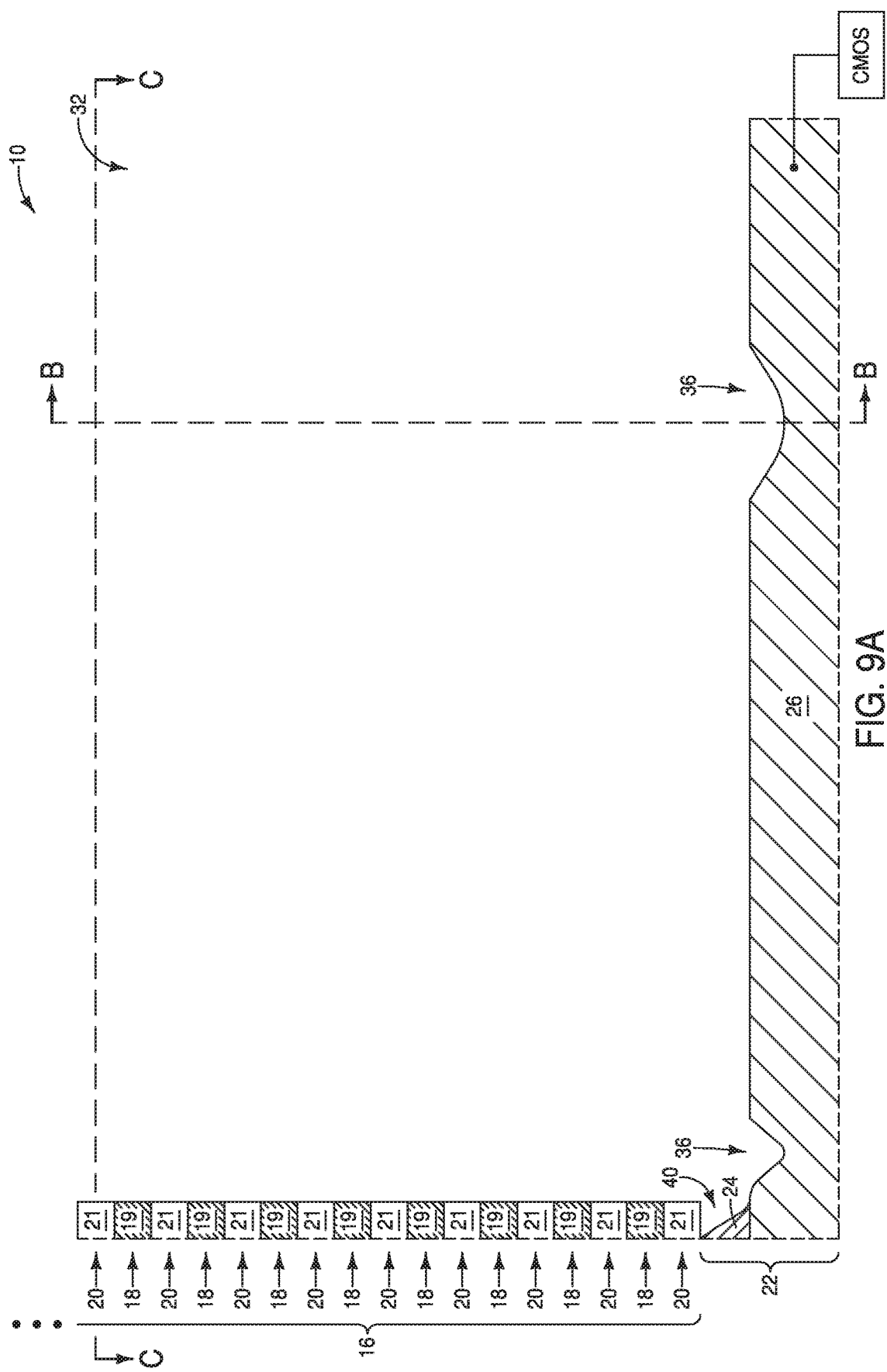
Figure 9B:
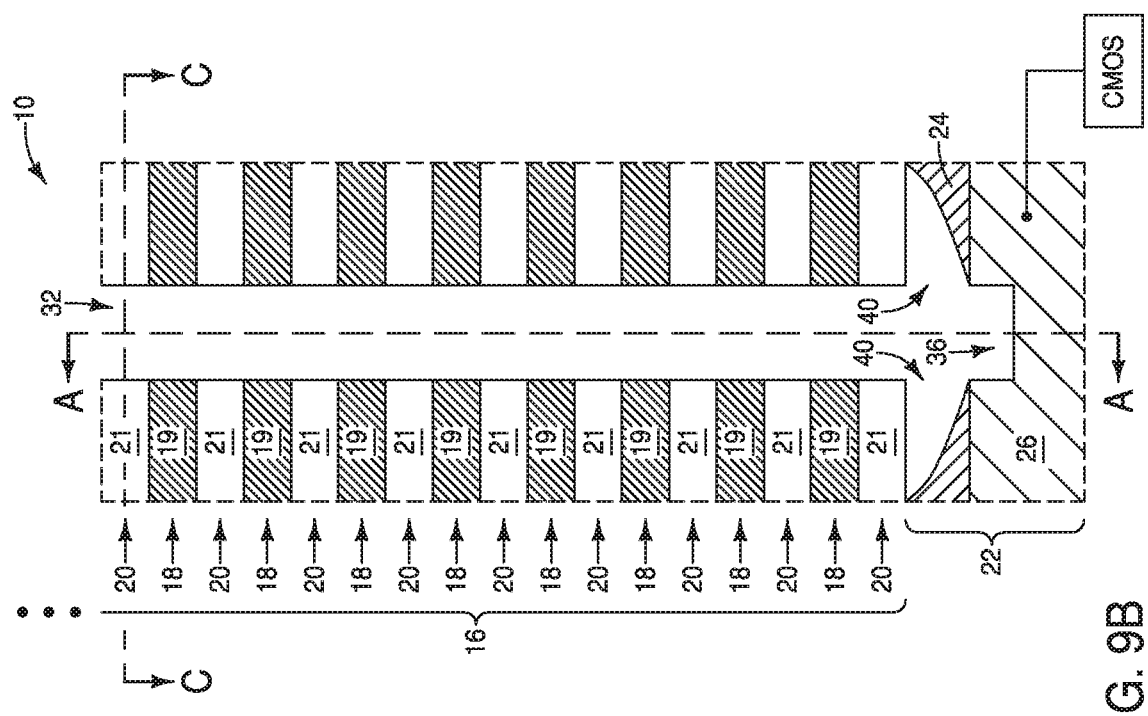

Referring to FIGS. 9-9B, the conductive material 19 is formed within the voids 30 (FIGS. 8-8B) to form the stack 16 described above with reference to FIGS. 5-5B. Such may be accomplished with any suitable processing. In some embodiments, the formation of the conductive material 19 within the voids 30 will comprise deposition of the conductive material 19, followed by suitable etching to remove excess conductive material 19 from within the slits 32. In subsequent processing, the insulative material 14 may be formed within the slits 32 to thereby form the partition 12 described above with reference to FIGS. 5-5B. Unfortunately, the voids 40 weaken the support under regions of the stack 16, which can problematically lead warping, collapse, etc., of regions of the stack 16.

Some embodiments include processing which may prevent the problems described with reference to FIGS. 6-9. An example method is described with reference to FIGS. 10-14.

Figure 10A:
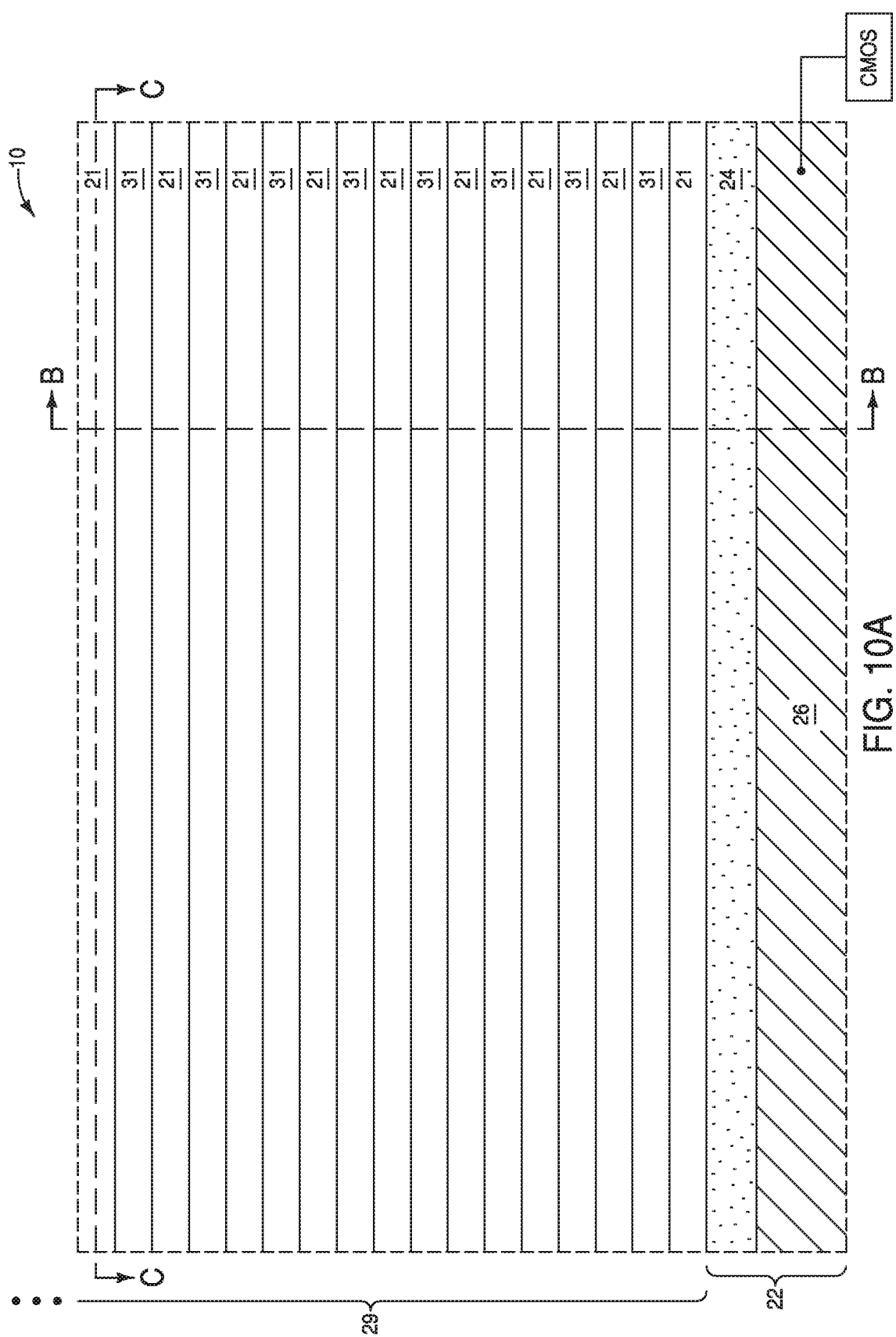
Figure 10B:
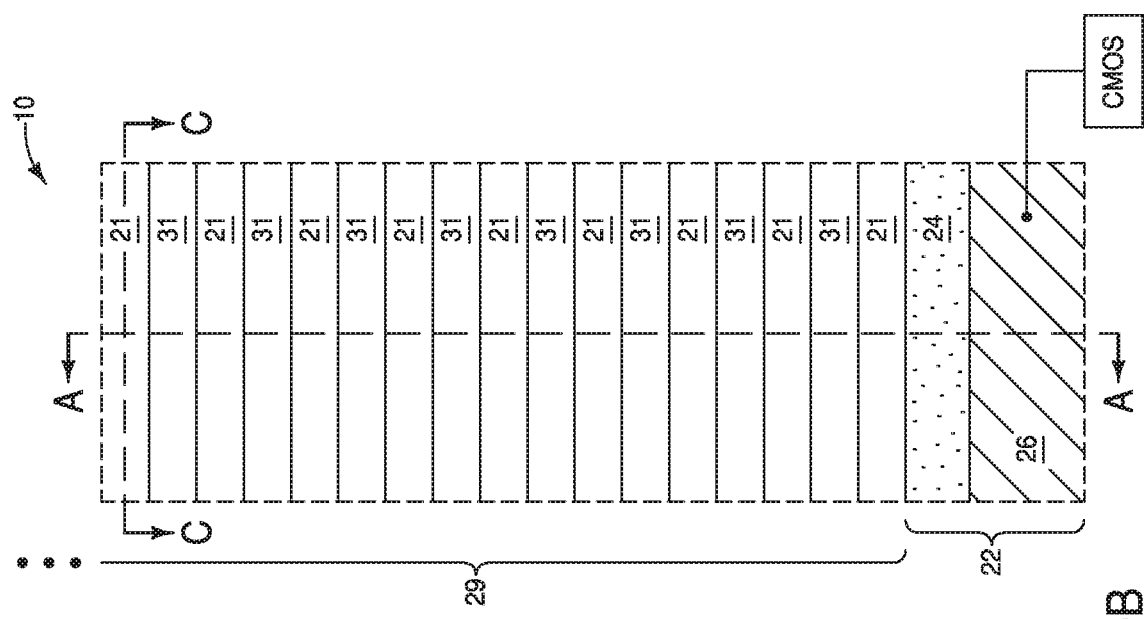

Referring to FIGS. 10-10B, construction 10 is shown at a processing stage analogous to that of FIGS. 6-6B. The construction of FIGS. 10-10B includes the stack 29 having the alternating materials 21 and 31.

The construction of FIGS. 10-10B differs from that of FIGS. 6-6B in that the semiconductor-containing material 24 is altered in the construction of FIG. 10-10B relative to the material shown in the construction of FIGS. 6-6B. Stippling is utilized in the construction of FIGS. 10-10B to indicate that one or more modifying substances (e.g., carbon and/or metal) have been distributed throughout the semiconductor-containing material 24. The semiconductor-containing material 24 may also comprise one or more conductivity-enhancing dopants (e.g., one or more of more of phosphorus, boron and arsenic) distributed therein to provide desired conductivity throughout the semiconductor-containing material 24. In some embodiments, a total concentration of the conductivity-enhancing dopant within the semiconductor-containing material 24 may be at least about $10^{22}$ atoms/cm$^3$. The semiconductor-containing material 24 is shown with stippling rather than cross-hatching in the embodiment of FIG. 10-10B to emphasize the distribution of the modifying substances within the semiconductor-containing material rather than emphasizing the conductivity of the semiconductor-containing material, but it is to be understood that such a semiconductor-containing material is also suitably conductive for utilization in the conductive structure 22.

In some embodiments, the modifying substance may be considered to be a dopant provided within the semiconductor-containing material 24; and such dopant may comprise carbon and/or one or more metals. The dopant may be implanted into the semiconductor-containing material prior to formation of the stack 29, as described in more detail below with reference to FIG. 20. The dopant may be provided to a concentration of at least about $10^{10}$ atoms/cm$^3$, at least about $10^{18}$ atoms/cm$^3$, at least about $10^{22}$ atoms/cm$^3$, etc.; and in the embodiment of FIGS. 10-10B the dopant is uniformly distributed throughout an entirety of the semiconductor-containing material 24.

If the dopant provided within the semiconductor-containing material 24 comprises metal, the metal may be selected from the group consisting of cobalt, molybdenum, nickel, ruthenium, tantalum, titanium, tungsten, and mixtures thereof. To the extent that the dopant within the semiconductor-containing material 24 comprises one or more metals, a total concentration of such one or more metals may be less than or equal to about $10^{23}$ atoms/cm$^3$ in some embodiments.

Figure 11:
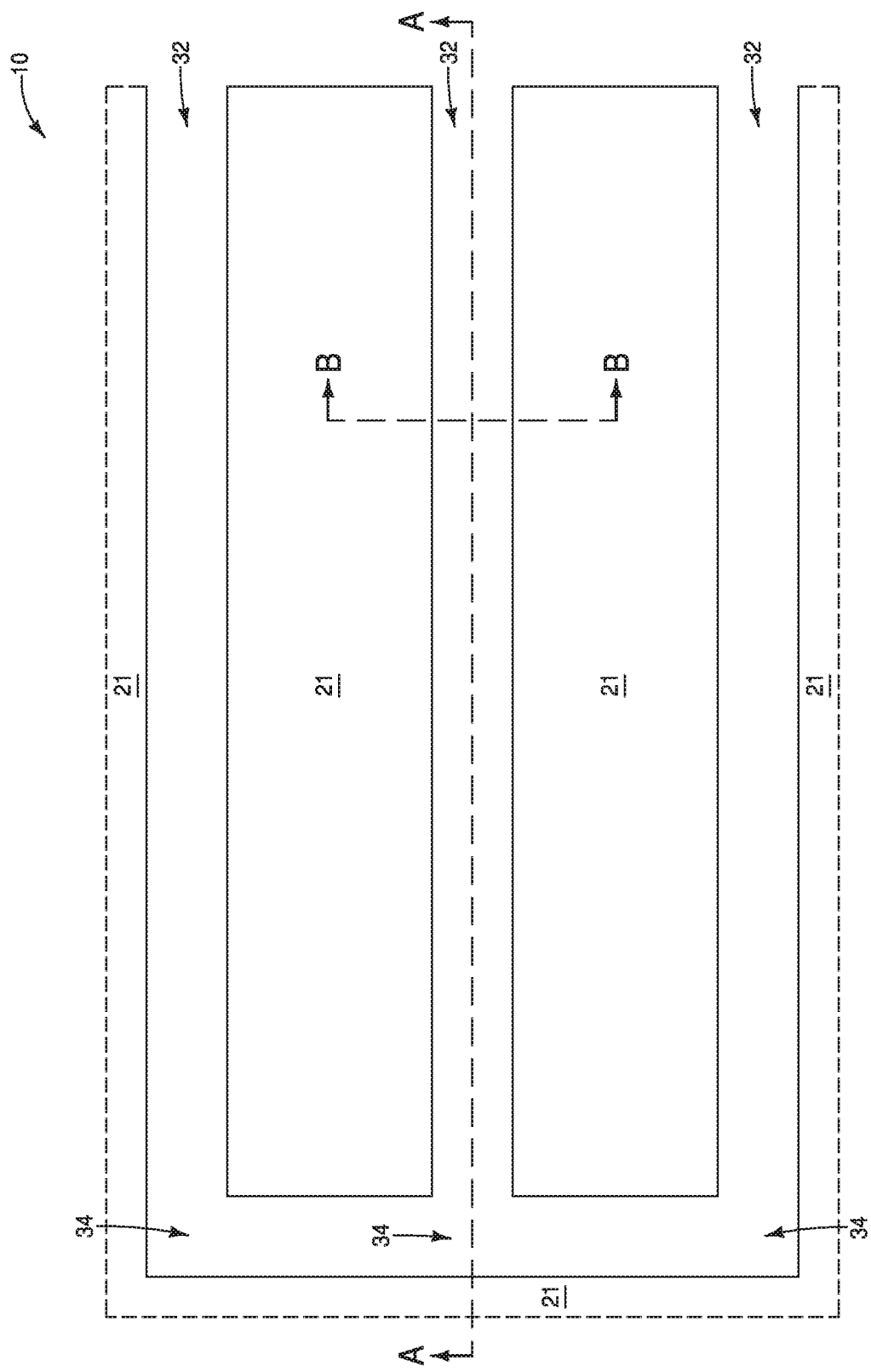
FIGS. 11-11B are views of the region of the integrated assembly of FIGS. 10-10B at an example process stage subsequent to the process stage of FIGS. 10-10B.

Referring to FIGS. 11-1B, the trenches (slits, openings) 32 are formed through the stack 29 to the conductive structure 22 with processing analogous to that described above with reference to FIGS. 7-7B. The slits 32 join to one another at the intersect regions (T-regions) 34. The cavities 36 are shown extending through the semiconductor-containing material 24 to expose the metal-containing material 26 of the conductive structure 22. The cavities 36 expose surfaces (regions) 33 of the semiconductor-containing material 24 and expose surfaces (regions) 35 of the metal-containing material 26.

Figure 11B:
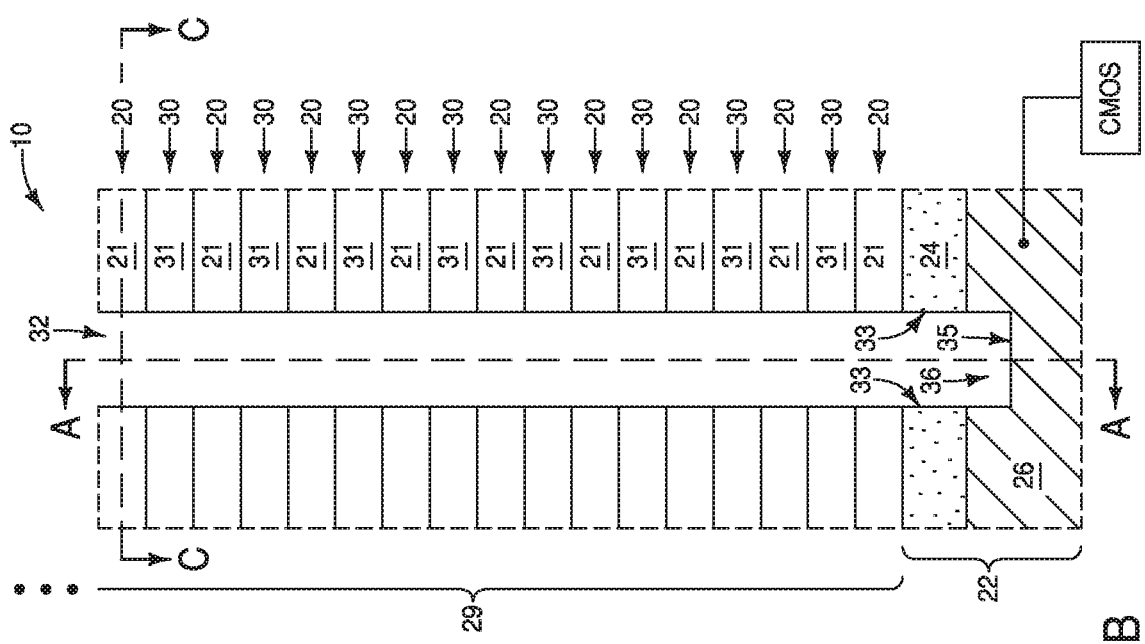
Figure 12:
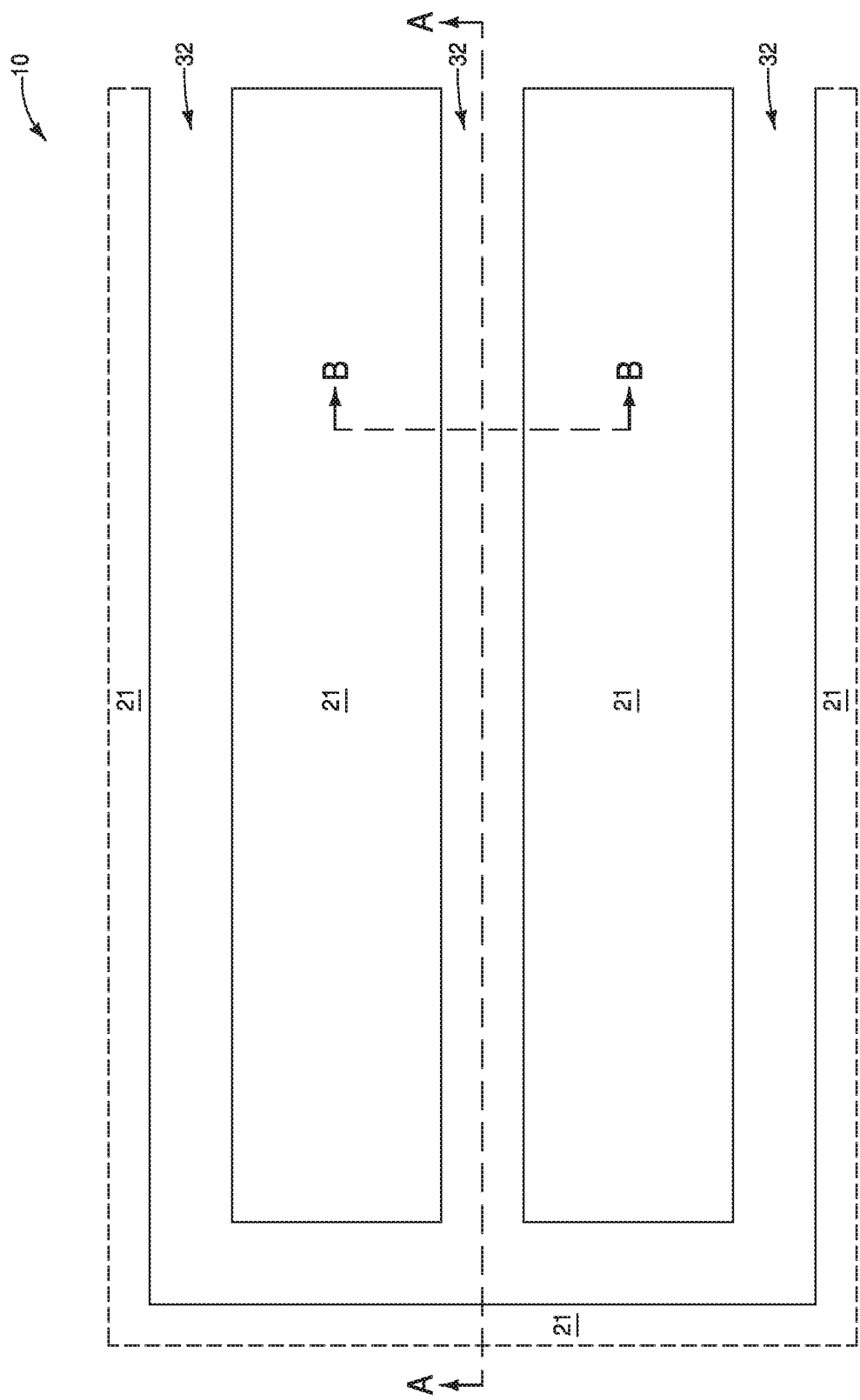
FIGS. 12-12B are views of the region of the integrated assembly of FIGS. 10-10B at an example process stage subsequent to the process stage of FIGS. 11-11B.
Figure 12B:
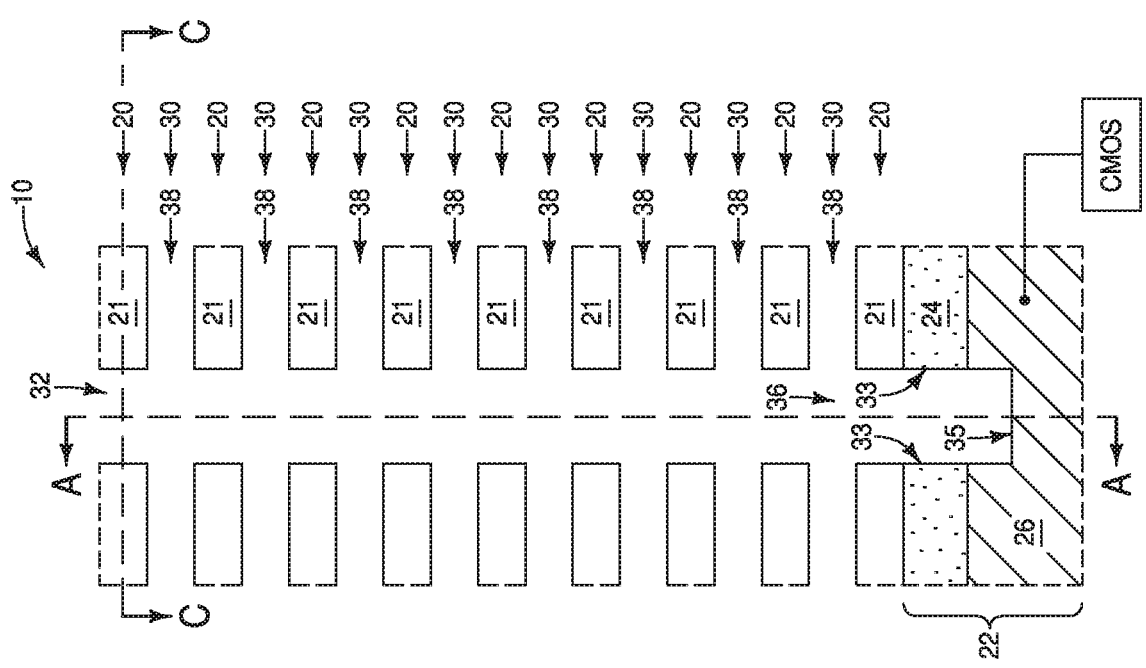

Referring to FIGS. 12-12B, the material 31 (FIGS. 11-11B) is removed to form the voids 38 with processing analogous to that described above with reference to FIGS. 8-8B. In some embodiments, the material 31 may comprise silicon nitride, and may be removed with an etch utilizing hot phosphoric acid. The modification of the semiconductor-containing material 24 may balance properties of the exposed surfaces 33 of semiconductor-containing material 24 relative to properties of the exposed surfaces 35 of the metal-containing material 26 (e.g., may balance bulk Fermi energy levels of the exposed surfaces) so that the galvanic reaction described above with reference to FIGS. 8-8B is alleviated, and in some embodiments entirely prevented. Accordingly, the problematic corrosion of the silicon-containing material 24 may be reduced, or even entirely avoided.

Figure 13:
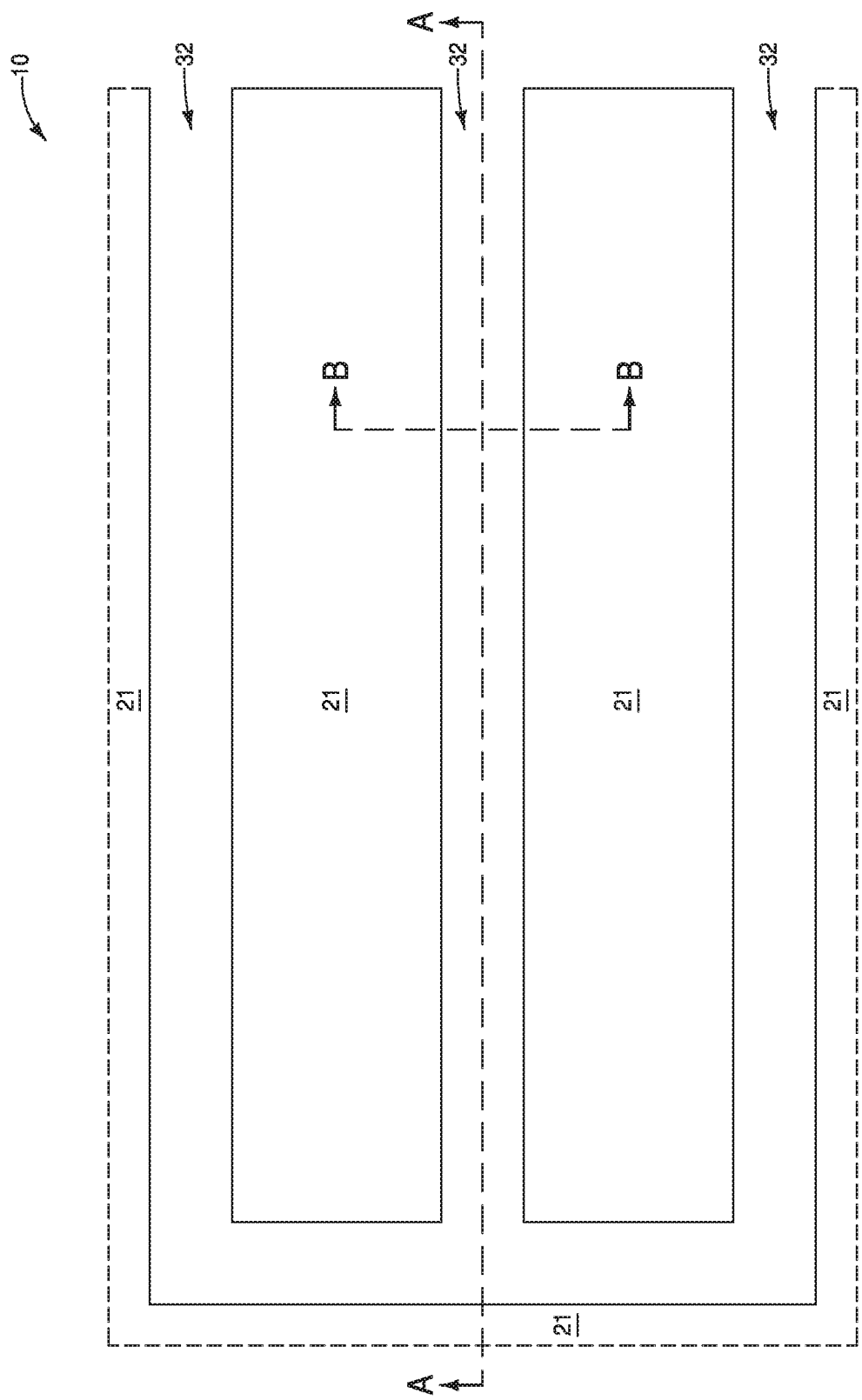
FIGS. 13-13B are views of the region of the integrated assembly of FIGS. 10-10B at an example process stage subsequent to the process stage of FIGS. 12-12B.
Figure 13A:
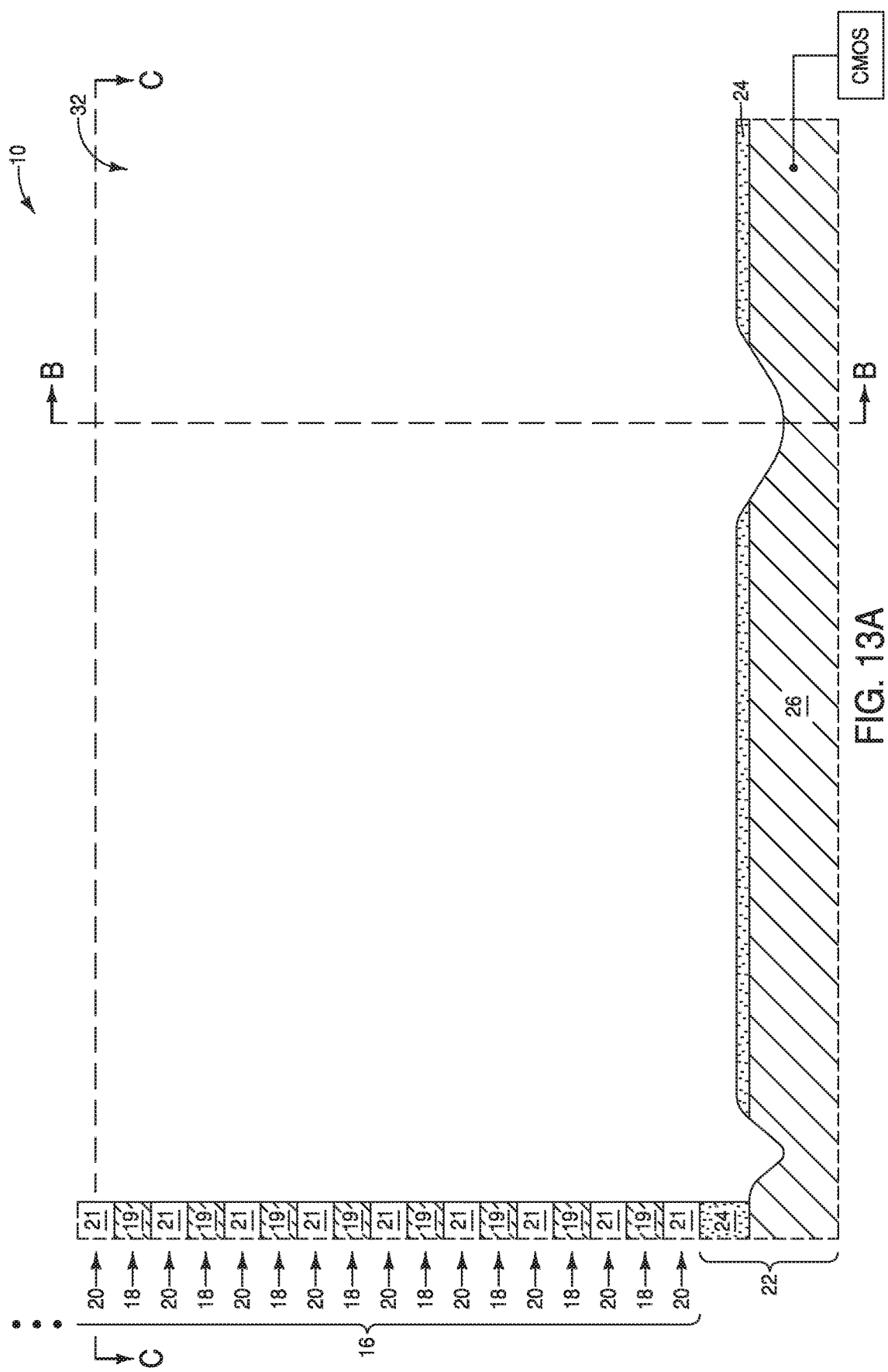
Figure 13B:
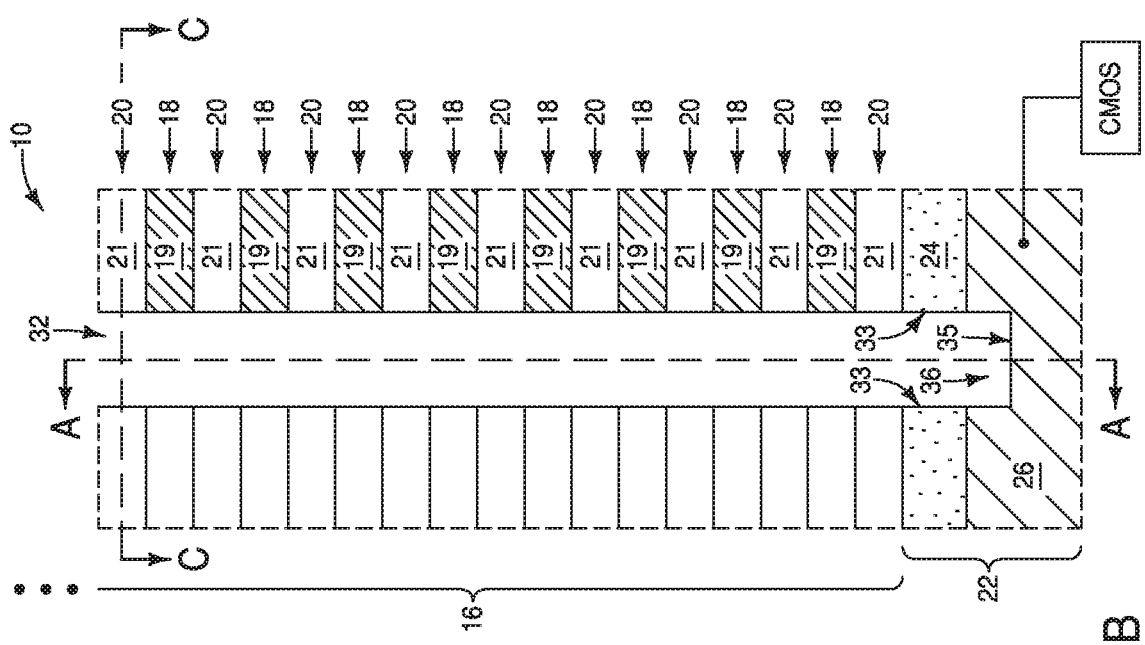

Referring to FIGS. 13-13B, the conductive material 19 is formed within the voids 38 (FIGS. 12-12B) to form the stack 16 described above with reference to FIGS. 5-5B. Although the voids 38 (FIGS. 12-12B) are shown to be filled only with conductive material, it is to be understood that at least some of the material formed in the voids may be insulative material (e.g., high-k dielectric material utilized as dielectric barrier material within NAND memory cells).

The conductive material 19 may form conductive levels of the memory device; and in some embodiments may form NAND wordline levels of a NAND memory assembly (e.g., NAND wordline levels of one or more of the NAND memory assemblies described above with reference to FIGS. 1-4).

Figure 14:
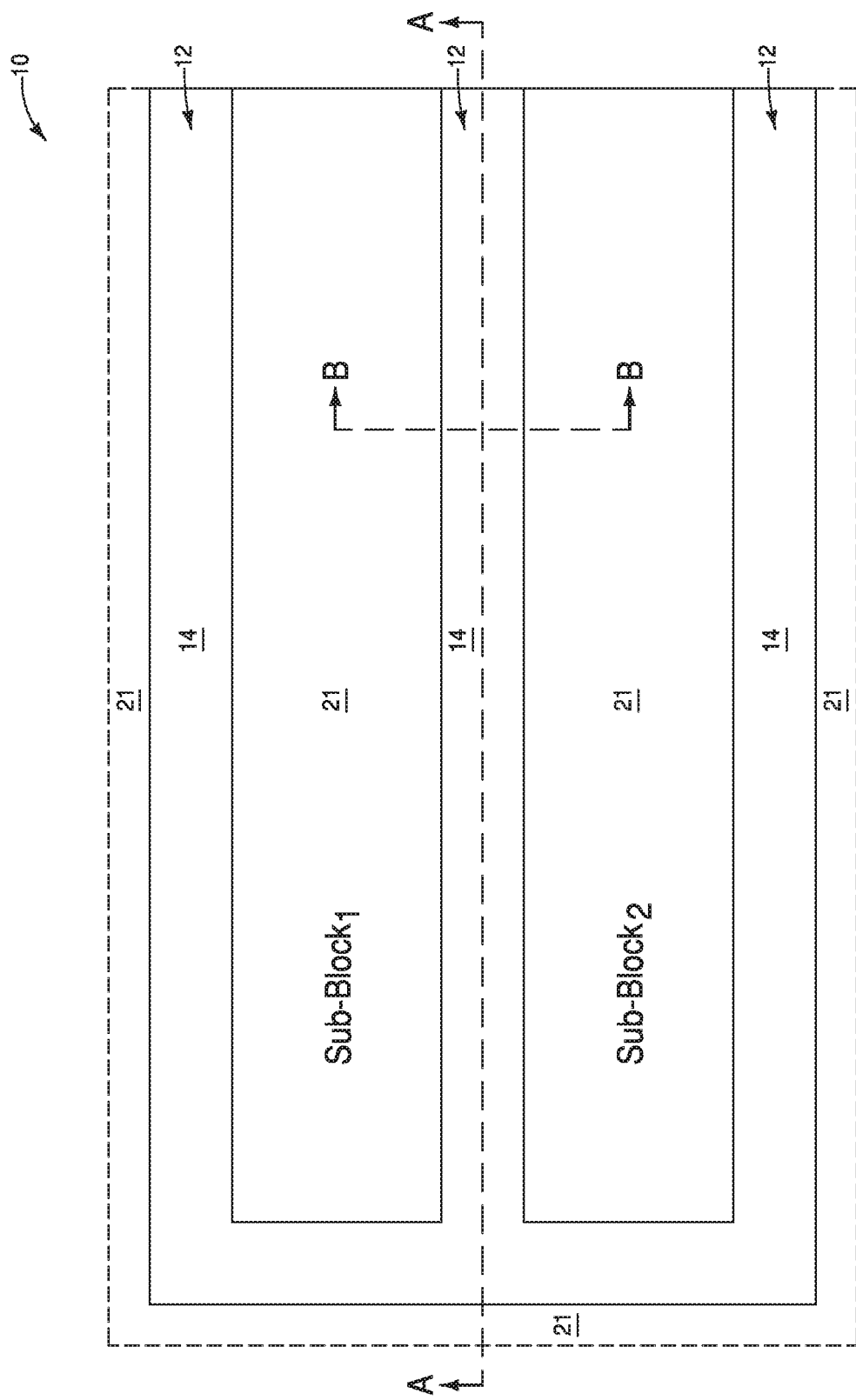
FIGS. 14-14B are views of the region of the integrated assembly of FIGS. 10-10B at an example process stage subsequent to the process stage of FIGS. 13-13B.
Figure 14A:
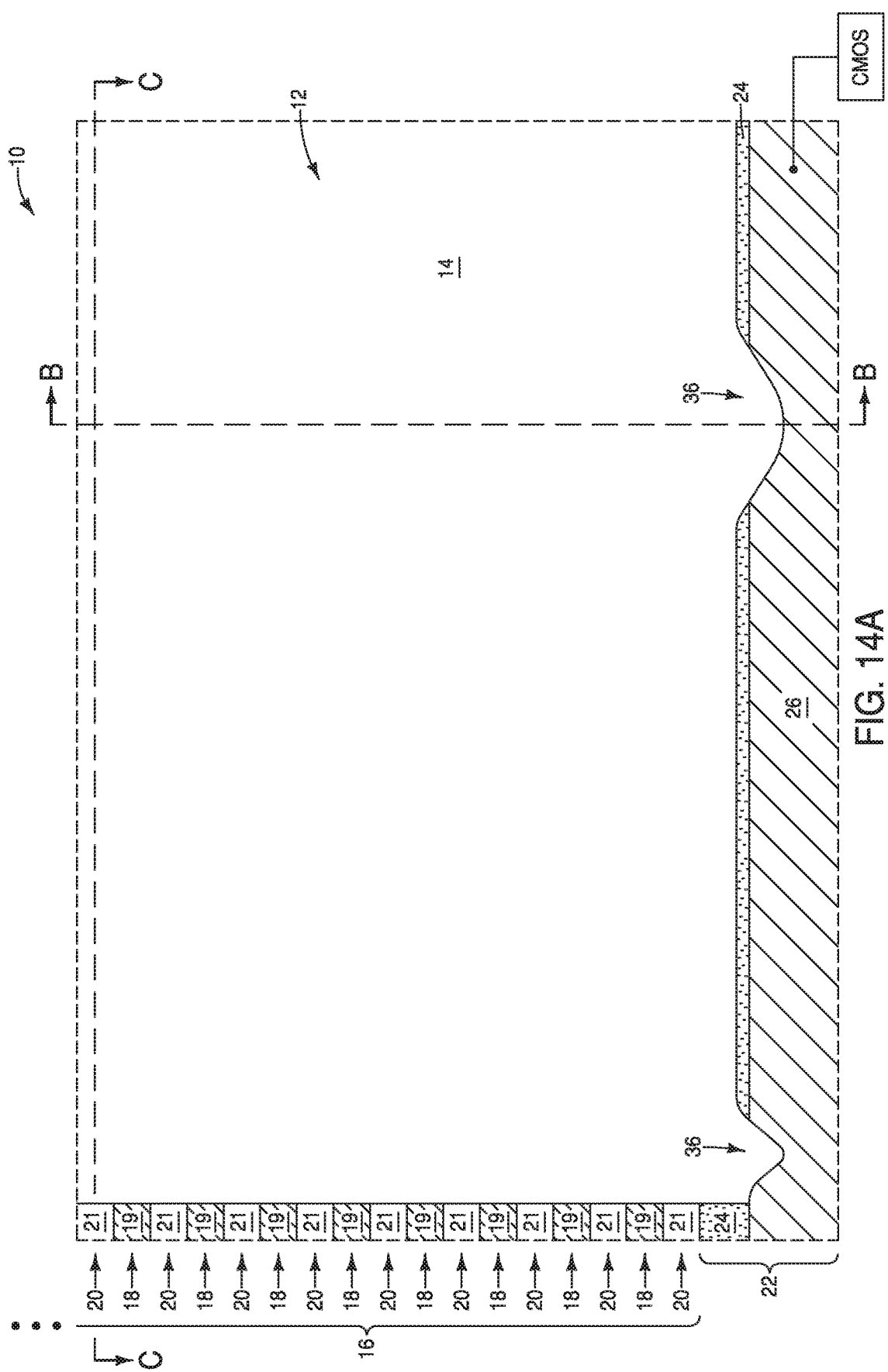
Figure 14B:
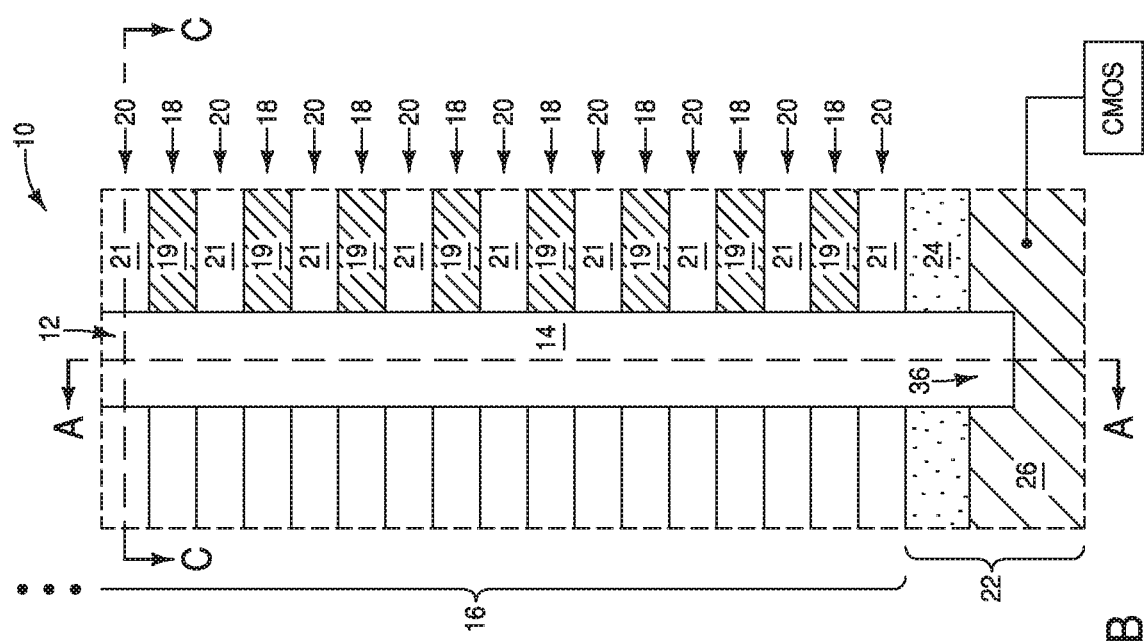

Referring to FIGS. 14-14B, the insulative partition material 14 is formed within the trenches 32 (FIGS. 13-13B) to form the partitions (panels) 12. In some embodiments the conductive material 19 forms wordline levels of a NAND memory assembly (NAND memory device), and the partitions 12 divide the NAND memory assembly into sub-blocks. In the illustrated embodiment, the partition 12 passes through the semiconductor-containing material 24 and into the metal-containing material 26 within the regions of the cavities 36.

The embodiment of FIGS. 10-14 has the modifying substance (i.e., the dopant comprising carbon and/or metal) uniformly distributed throughout an entirety of the semiconductor-containing material 24, and has such modifying substance provided within the semiconductor-containing material prior to the formation of the opening (trench) 32 (i.e., prior to the processing stage of FIGS. 11-11B). In other embodiments, the modifying substance may be provided within the semiconductor-containing material 24 after the formation of the opening 32, and may be provided only within regions proximate the opening 32. An example of such other embodiments is described with reference to FIGS. 15-19.

Figure 15:
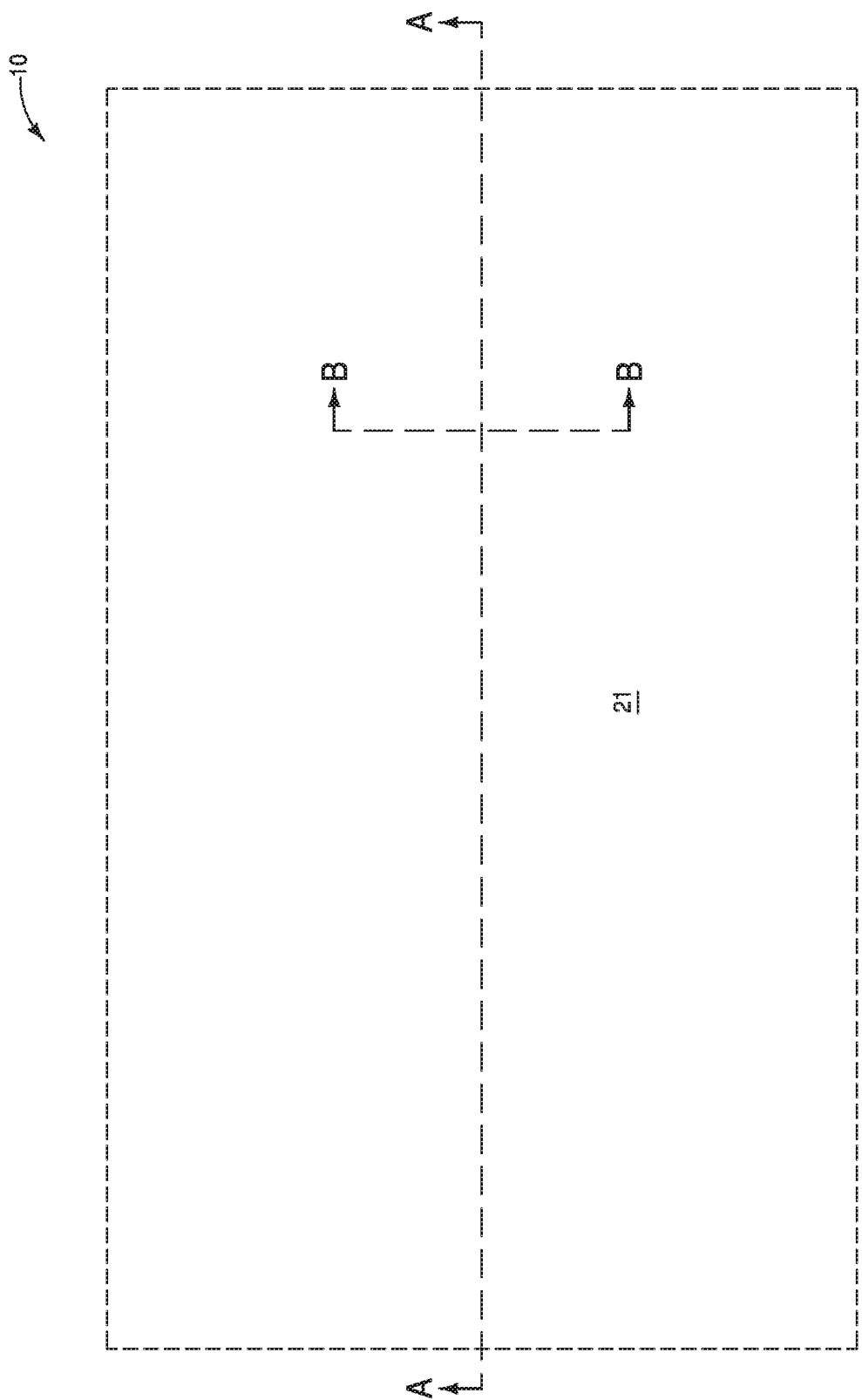
FIGS. 15-15B are views of a region of an integrated assembly at an example process stage of an example method of fabricating an example memory device.
Figure 15A:
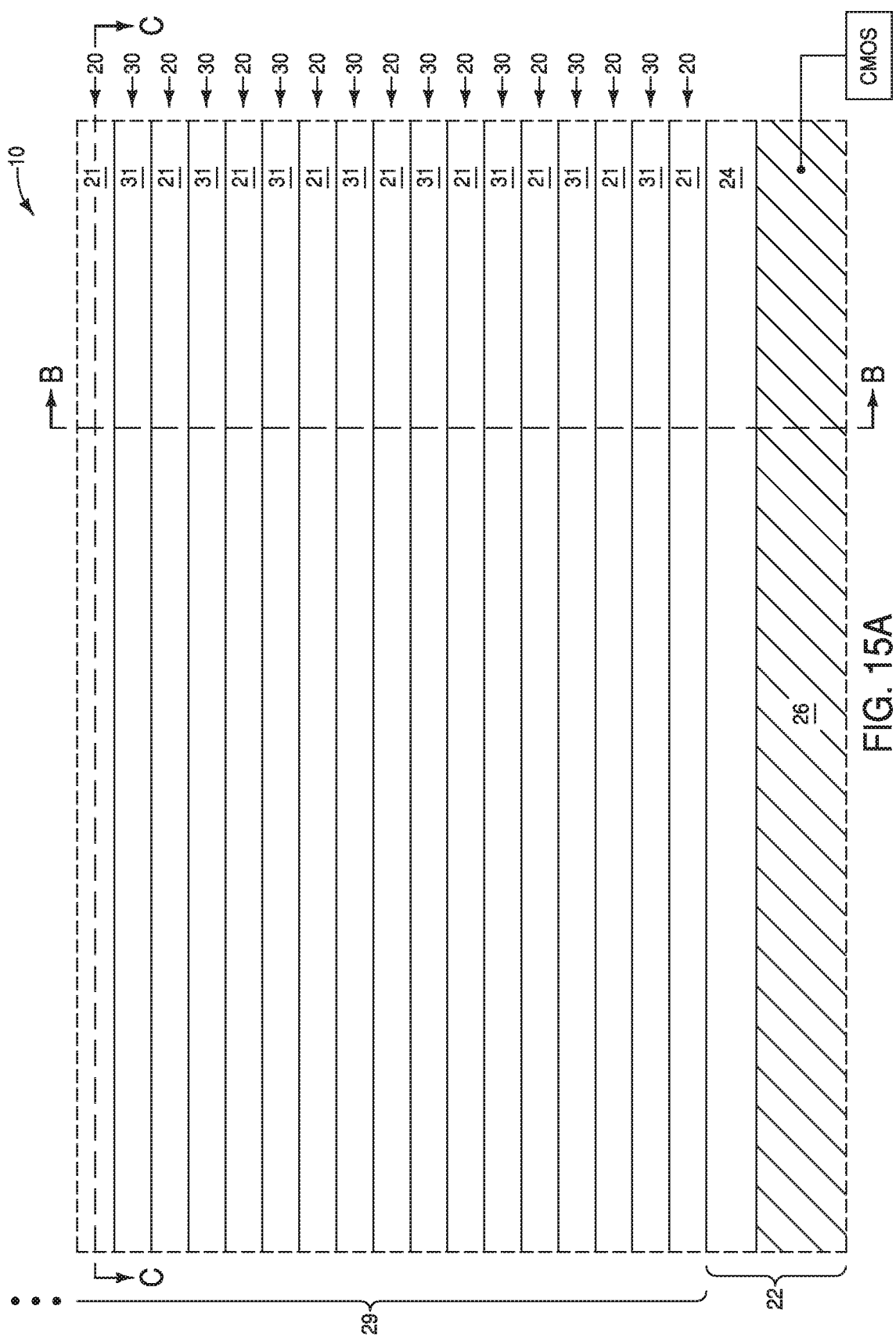
Figure 15B:
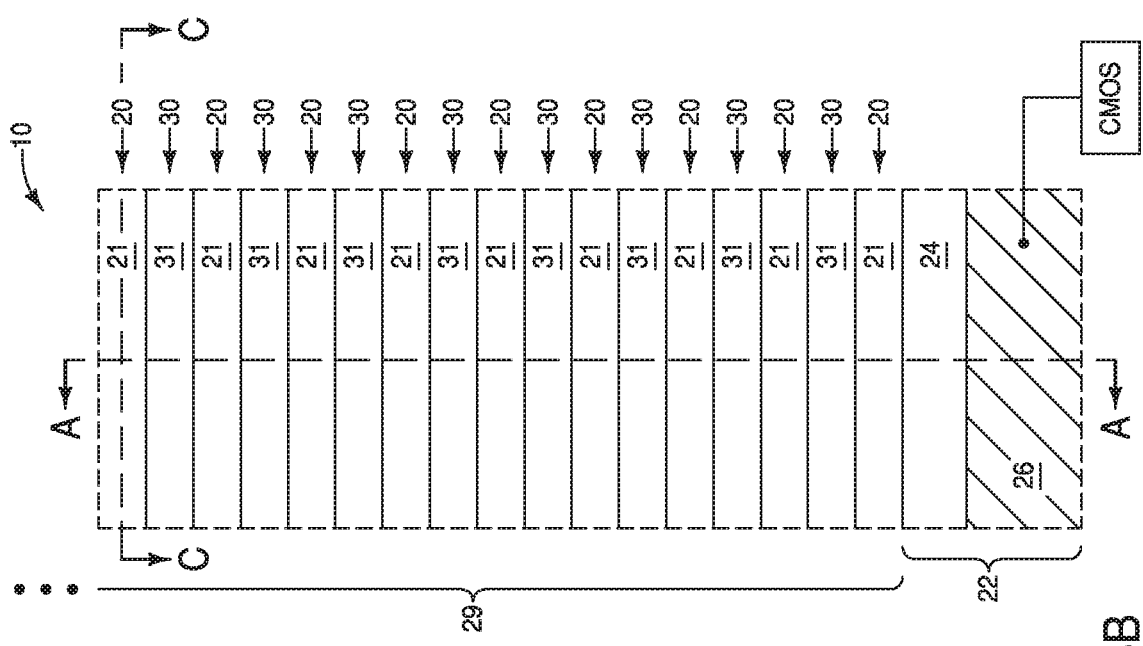

Referring to FIGS. 15-15B, the construction 10 is shown at a process stage identical to that of FIGS. 6-6B. The semiconductor-containing material 24 is shown without cross-hatching in FIGS. 15-15B so that stippling associated with the distribution of a modifying substance within the semiconductor-containing material 24 at later process stages will be visible. However, it is to be understood that the semiconductor-containing material 24 may be conductively-doped with one or more suitable conductivity-enhancing dopants at the process stage of FIGS. 15-15B.

Figure 16:
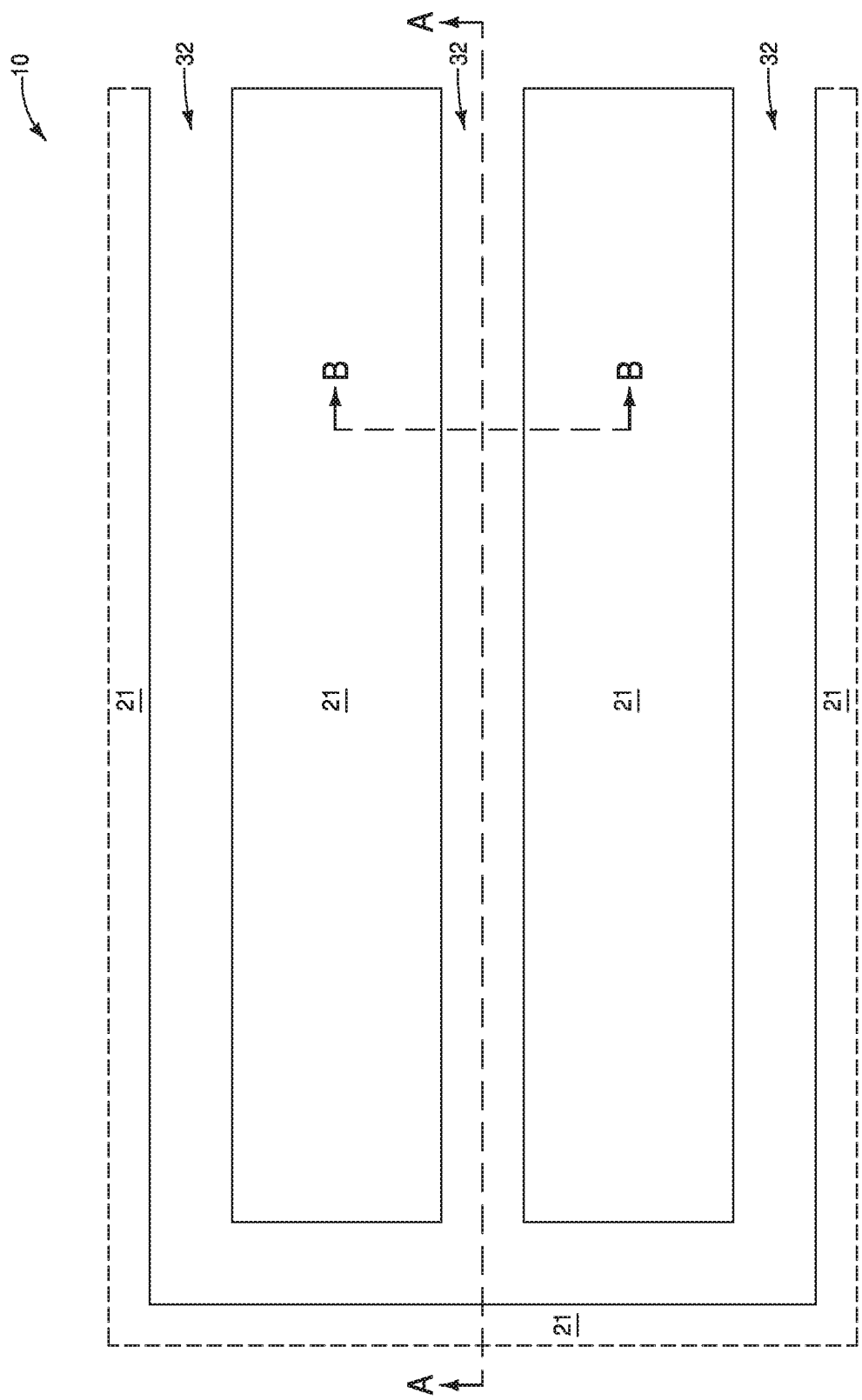
FIGS. 16-16B are views of the region of the integrated assembly of FIGS. 15-15B at an example process stage subsequent to the process stage of FIGS. 15-15B.
Figure 16A:
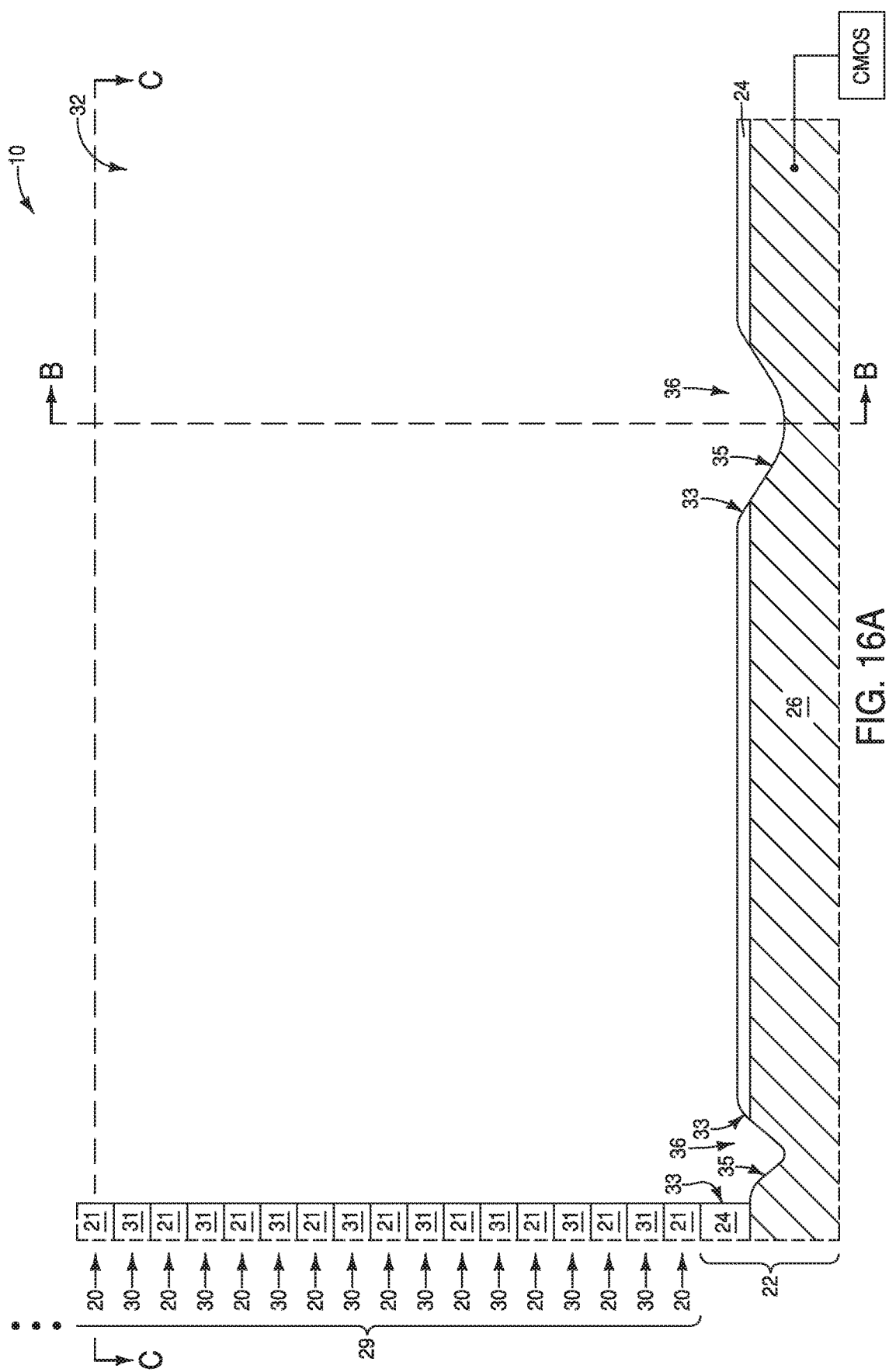
Figure 16B:
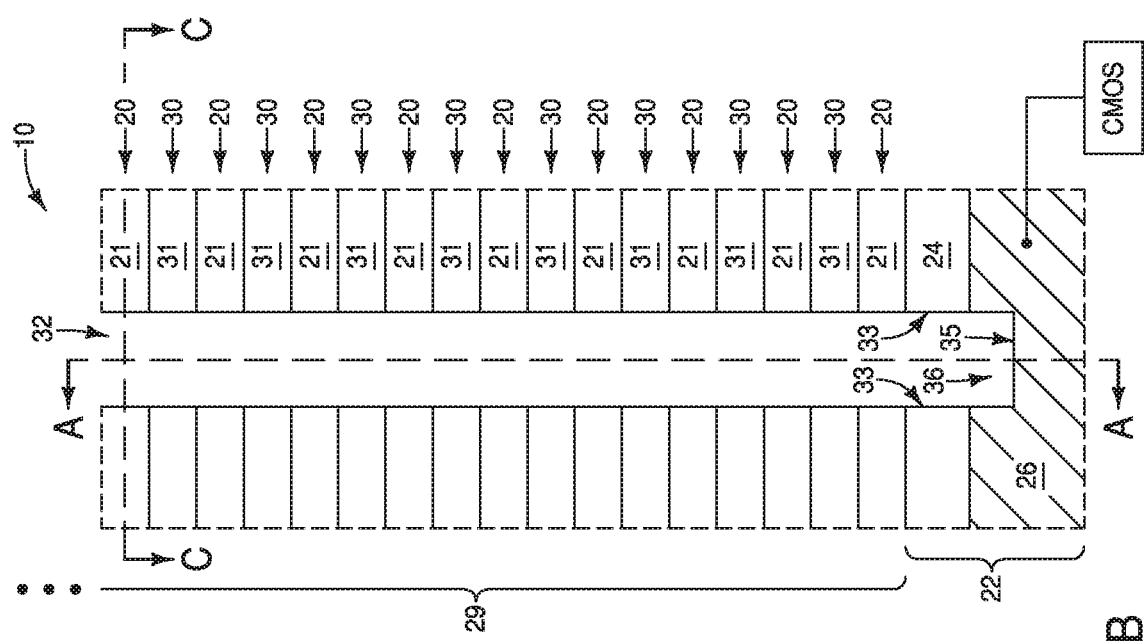

Referring to FIGS. 16-16B, the construction 10 is shown at a process stage analogous that of FIGS. 7-7B. The slits (trenches) 32 have been formed to extend through the stack 29; with regions of the trenches passing through the semiconductor-containing material and into the metal-containing material. Accordingly, surfaces (regions) 33 of the semiconductor-containing material 24 are exposed together with surfaces (regions) 35 of the metal-containing material 26. The exposed regions 33 of the semiconductor-containing material 24 within the cavities 36 are proximate the exposed regions 35 of the metal-containing material.

Figure 17:
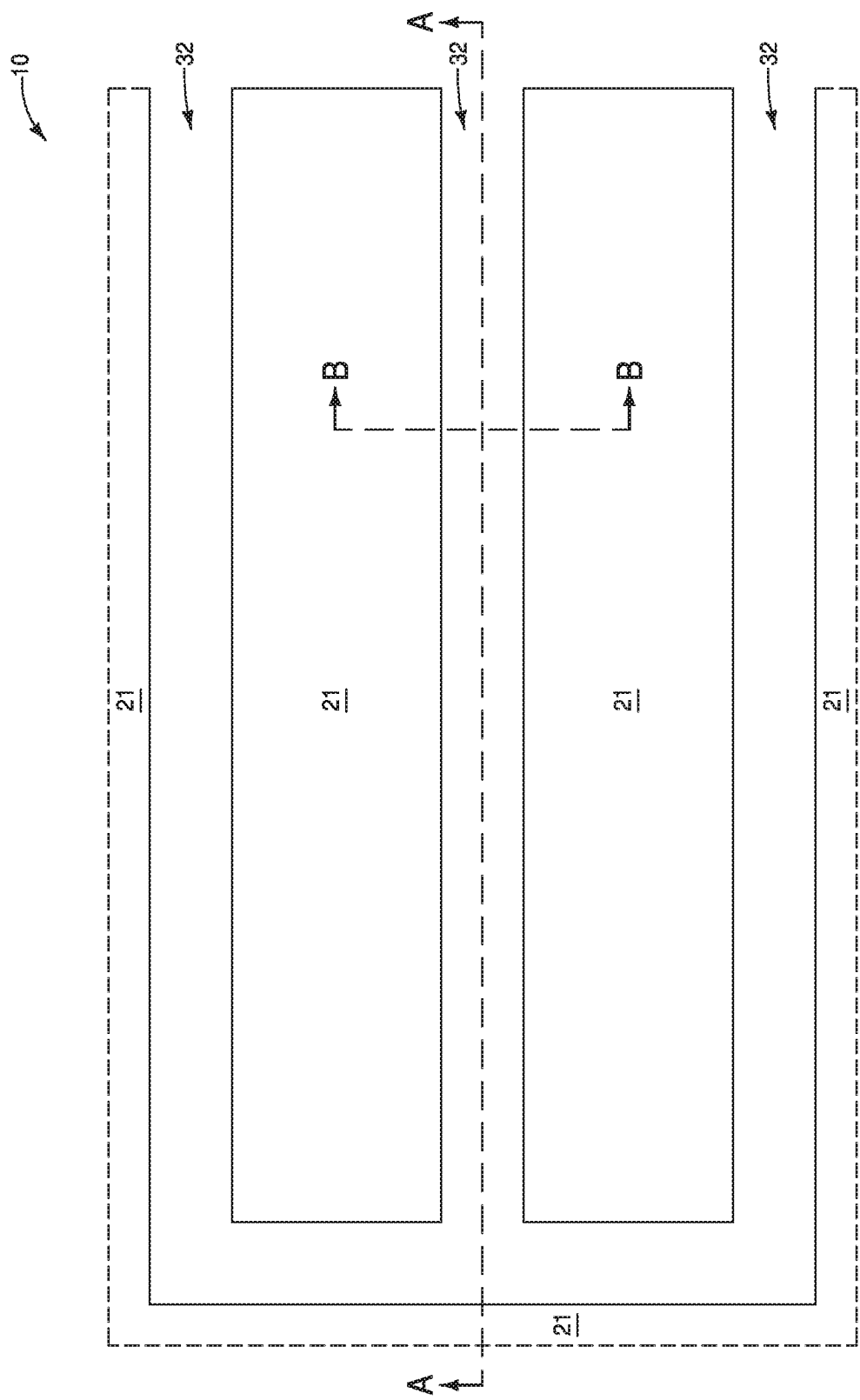
FIGS. 17-17B are views of the region of the integrated assembly of FIGS. 15-15B at an example process stage subsequent to the process stage of FIGS. 16-16B.
Figure 17B:
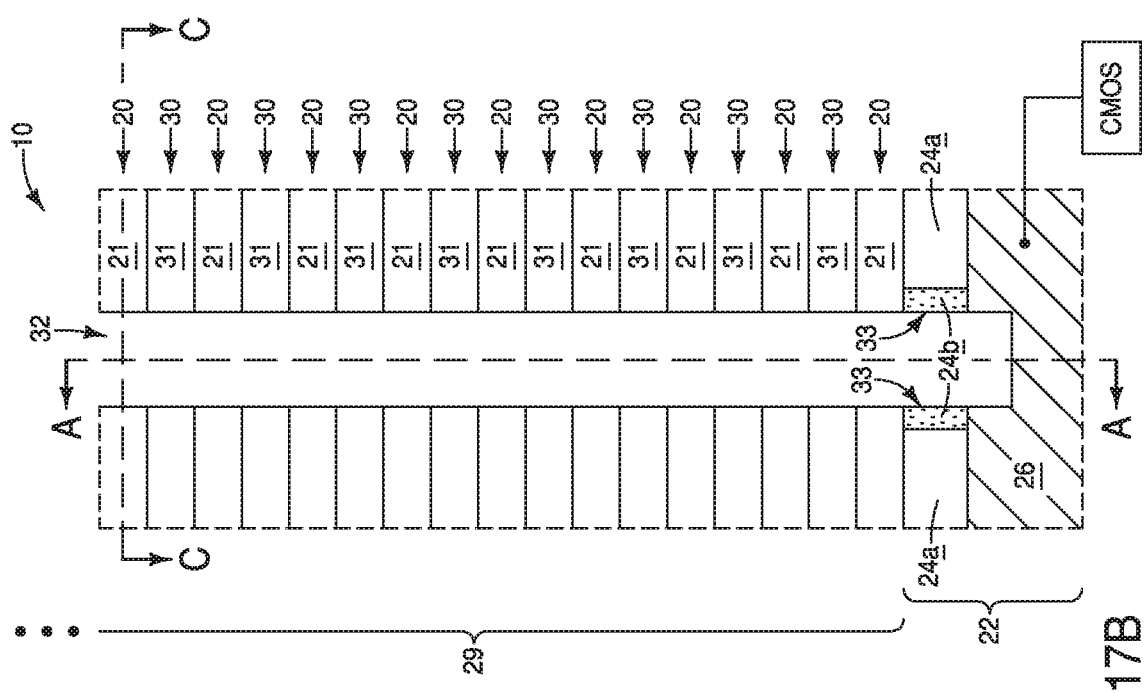

Referring to FIGS. 17-17B, dopant (e.g., carbon and/or one or more metals) is implanted into the exposed regions 33 of the semiconductor-containing material 24 to form modified regions of such semiconductor-containing material. The modified regions are indicated in the cross-sectional views of FIGS. 17A and 17B with stippling. Further, the semiconductor-containing material 24 is shown to comprise two different compositions; with one of the compositions being 24a and corresponding to a portion of the material 24 which is not modified with the dopant, and the other of the compositions being 24b and corresponding to a portion of the material 24 which is modified with the dopant.

Figure 18:
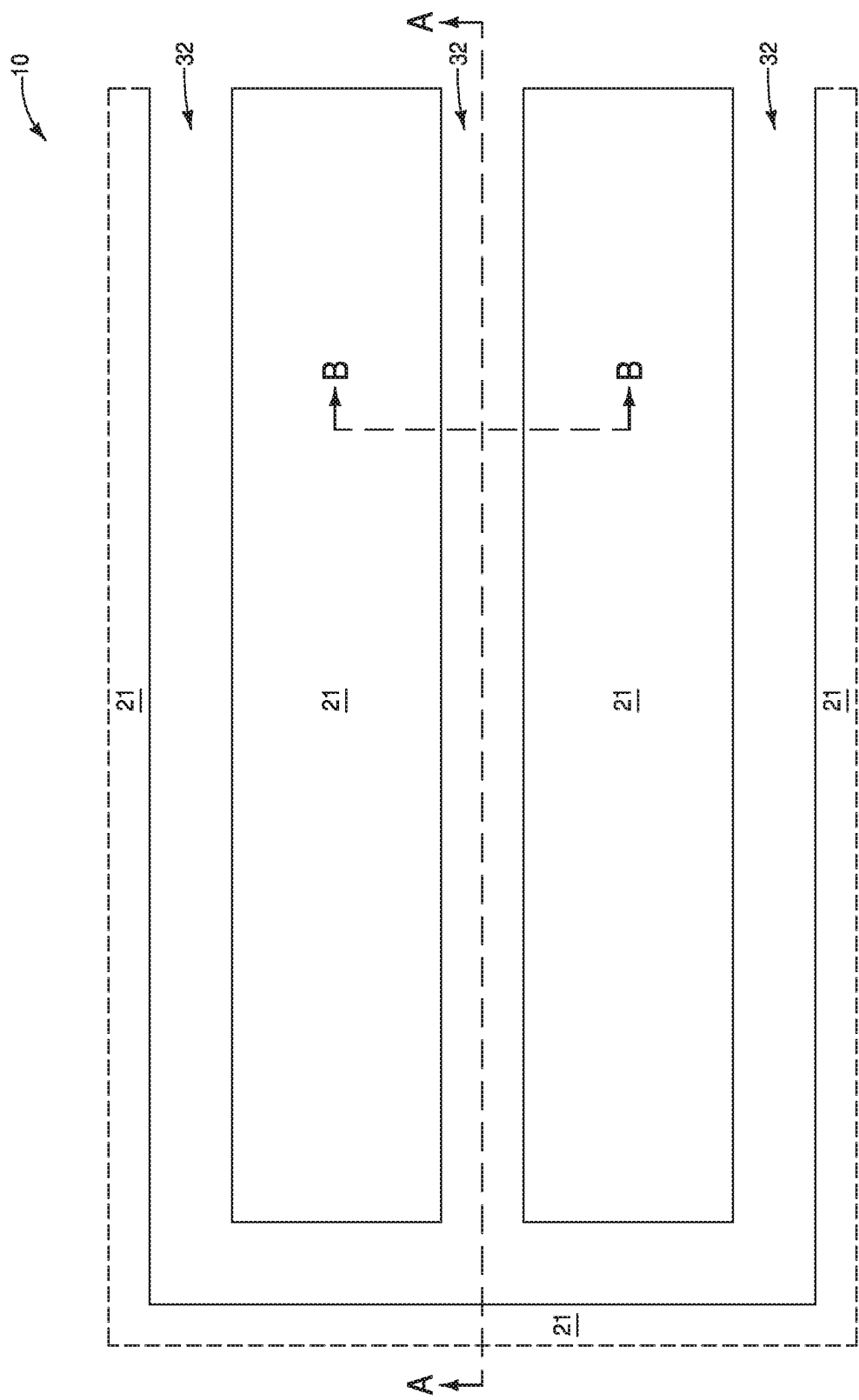
FIGS. 18-18B are views of the region of the integrated assembly of FIGS. 15-15B at an example process stage subsequent to the process stage of FIGS. 17-17B.
Figure 18A:
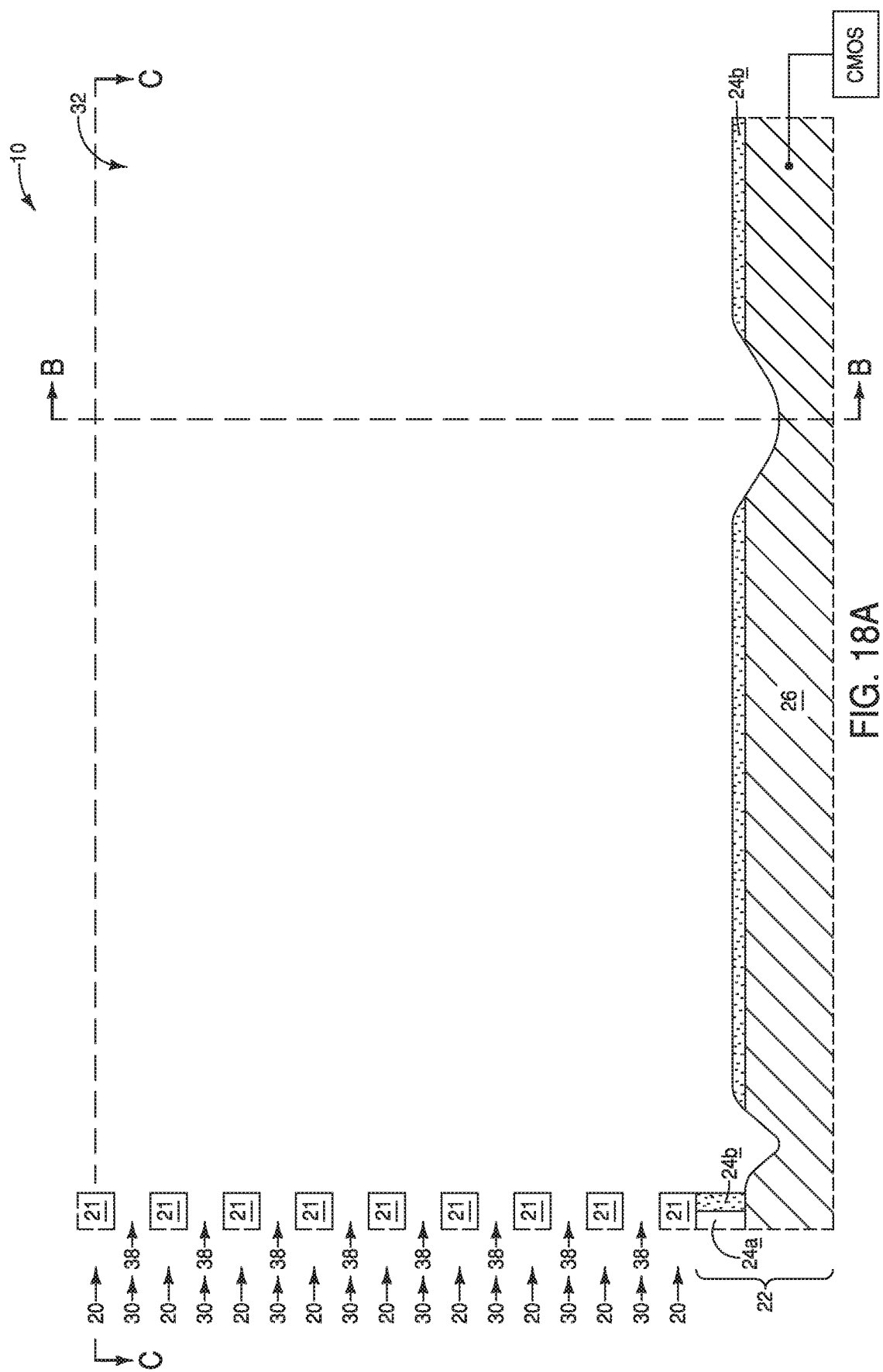
Figure 18B:
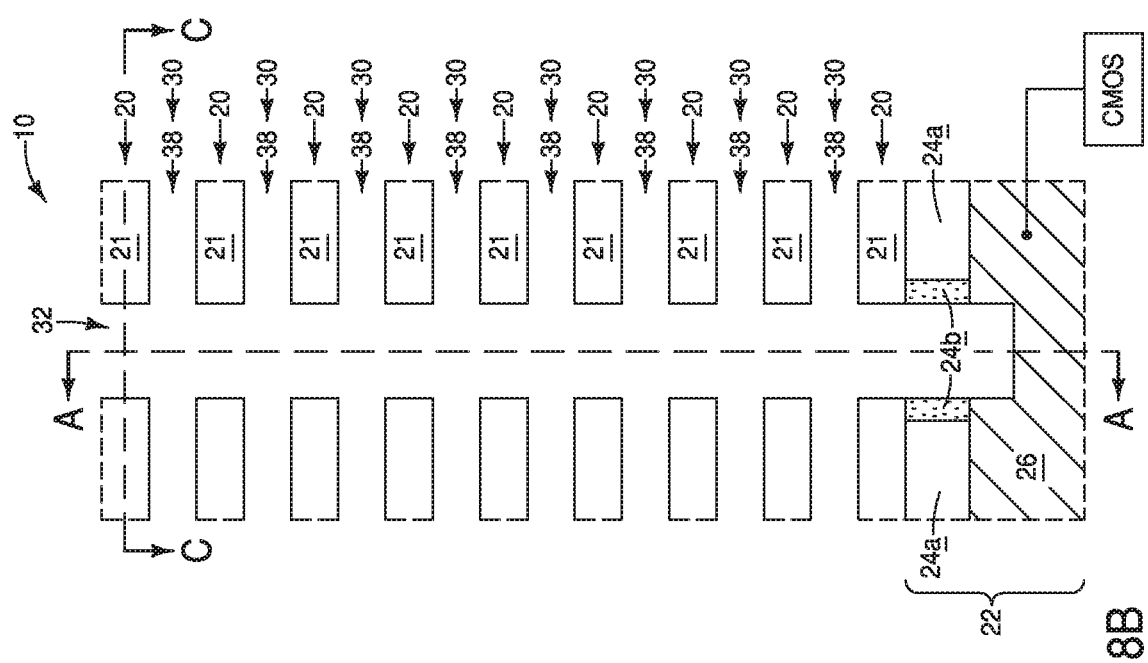

Referring to FIGS. 18-18B, the material 31 (FIGS. 17-17B) is removed to form the voids 38 with processing analogous to that described above with reference to FIGS. 12-12B.

Figure 19:
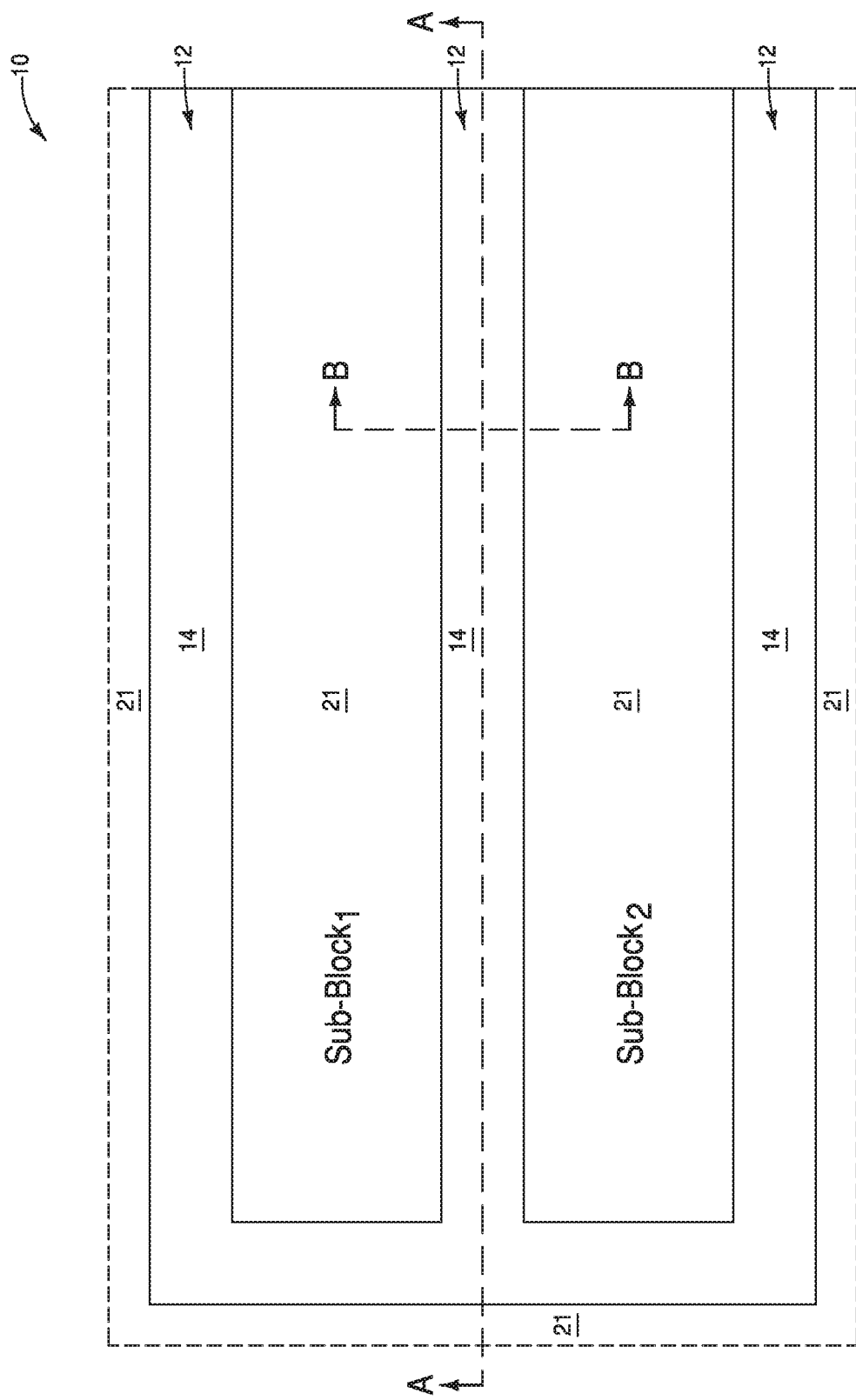
FIGS. 19-19B are views of the region of the integrated assembly of FIGS. 15-15B at an example process stage subsequent to the process stage of FIGS. 18-18B.
Figure 19A:
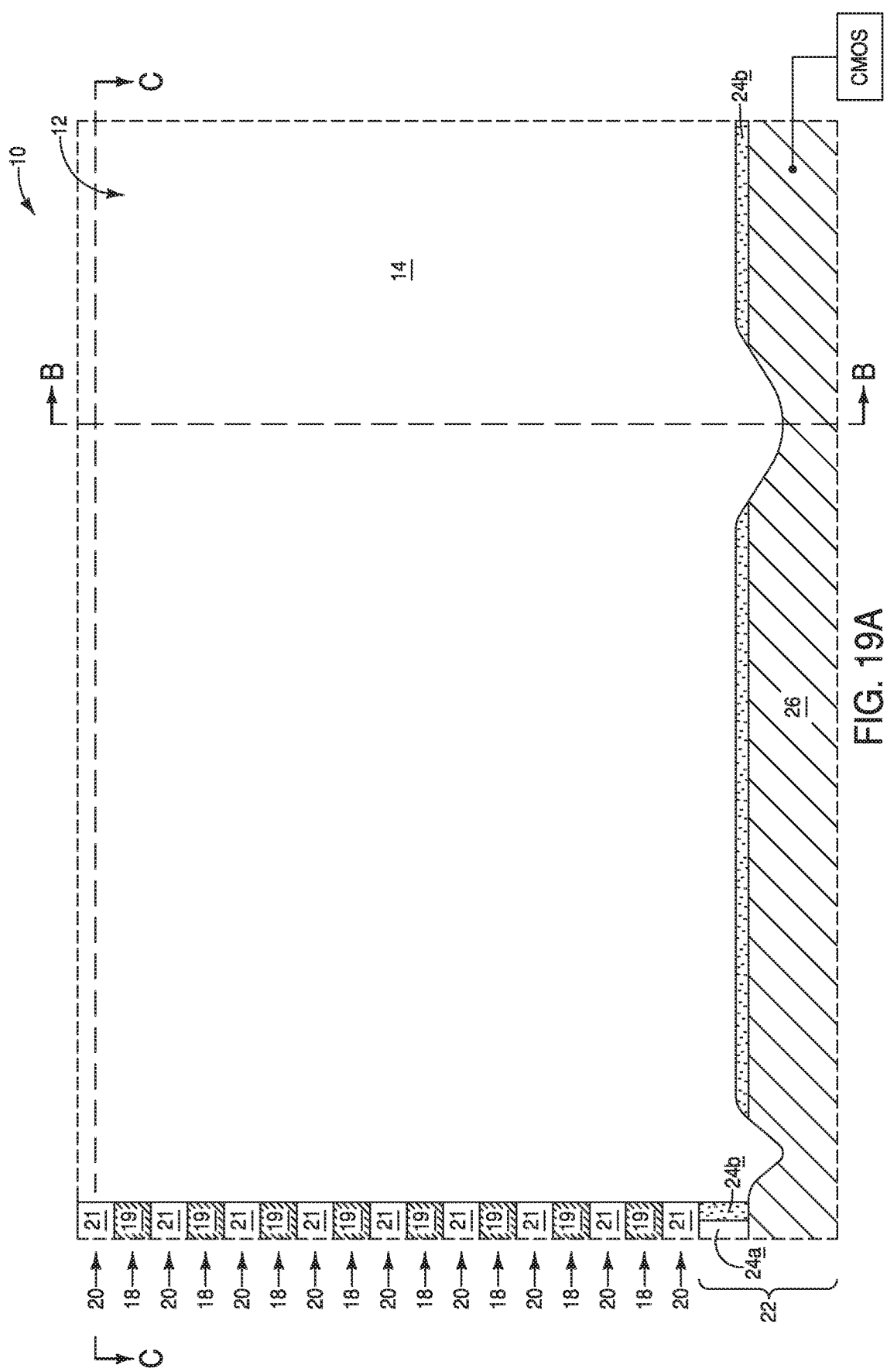
Figure 19B:
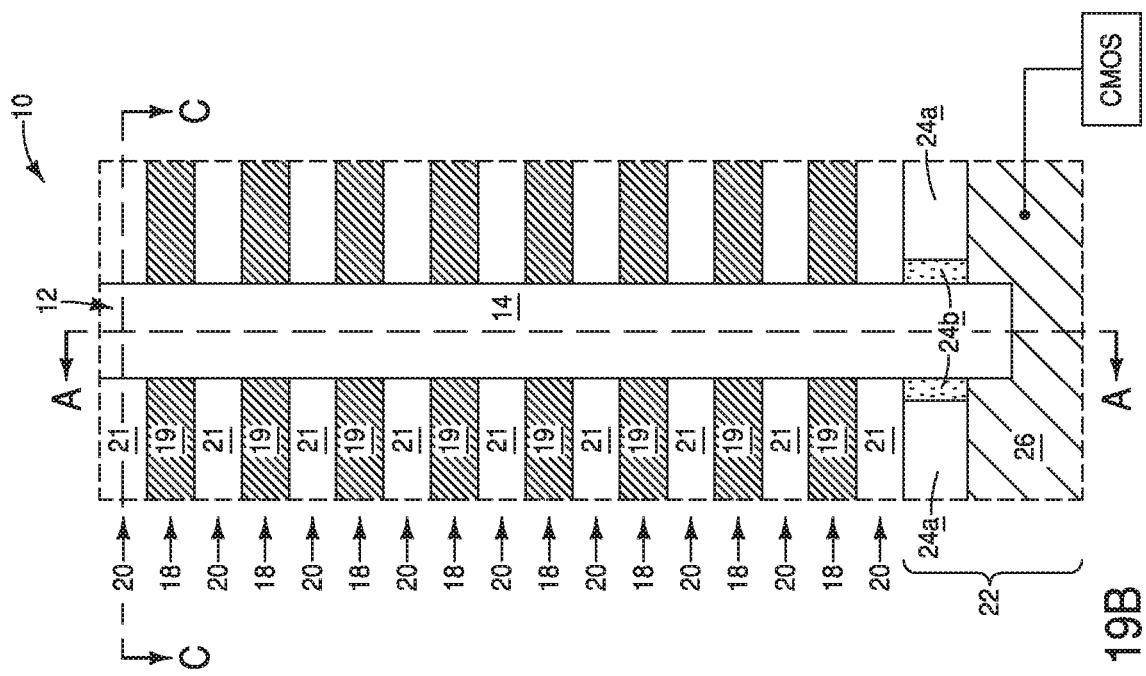

Referring to FIGS. 19-19B, the conductive material 19 is formed within the voids 38 (FIGS. 18A and 18B) to form conductive regions of the conductive levels of a memory device. Subsequently, the insulative partition 12 is formed within the trench 32 (FIGS. 18-18B). The insulative partition divides the memory device into sub-blocks.

The configuration of FIGS. 19-19B differs from that of FIG. 14-14B in that the modifying substance (e.g., carbon and/or one or more metals) is not uniformly distributed throughout an entirety of the semiconductor-containing material 24, but is instead primarily within regions of the semiconductor-containing material proximate the partition 12 (as indicated by the stippling within the semiconductor-containing material 24).

As discussed above with reference to FIGS. 10-10B, in some embodiments the modifying substance (e.g., carbon and/or one or more metals) may be implanted into the semiconductor-containing material 24 of the conductive structure 22 prior to forming the stack 29 over the conductive structure. FIG. 20 diagrammatically illustrates an example process in which modifying substance is implanted into the semiconductor-containing material 24. Specifically, FIG. 20 illustrates a first process stage (Stage-1) in which the structure 22 is formed to comprise the semiconductor-containing material 24 over the metal-containing material 26. Subsequently, the structure 22 is exposed to a process 100 to modify the semiconductor-containing material 24, and thereby transition the structure to a second process stage (Stage-2). The process 100 may be an ion implant of carbon, and/or may be an ion implant of one or more metals. The ion implant memory may or may not be plasma assisted. To the extent that the ion implant is plasma assisted, the plasma may or may not be remote relative to the structure 22.

The implant of the carbon and/or one or more metals into the material 24 may be conducted before, after, or during the provision of one or more conductivity-enhancing dopants (e.g., one or more of phosphorus, boron and arsenic) within the material 24.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions. etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method of forming an integrated assembly. A stack of alternating first and second materials is formed over a conductive structure. The conductive structure includes a semiconductor-containing material over a metal-containing material. An opening is formed to extend through the stack and through the semiconductor-containing material, to expose the metal-containing material. A bottom of the opening includes regions of the semiconductor-containing material and regions of the metal-containing material. The semiconductor-containing material is doped with carbon and/or with one or more metals. After the doping of the semiconductor-containing material, the second material of the stack is removed to form voids. Conductive material is formed within the voids. Insulative material is formed within the opening.

Some embodiments include a method of forming an integrated assembly. A stack of alternating first and second materials is formed over a conductive structure. The conductive structure comprises a semiconductor-containing material over a metal-containing material. A trench is formed to extend through the stack. At least some regions of the trench pass through the semiconductor-containing material to expose regions of the metal-containing material. Regions of the semiconductor-containing material are exposed along the trench. Dopant is implanted into the exposed regions of the semiconductor-containing material. The implanted dopant comprises carbon and/or one or more metals. The second material of the stack is removed to form voids. Conductive material is formed within the voids to form conductive regions of conductive levels of a memory device. An insulative partition is formed within the trench. The insulative partition divides the memory device into sub-blocks.

Some embodiments include an integrated assembly having a conductive structure comprising a semiconductor-containing material over a metal-containing material. The semiconductor-containing material comprises carbon therein at a concentration of at least about $10^{10}$ atoms/cm$^3$. A stack of alternating conductive levels and insulative levels is over the conductive structure. A partition extends through the stack and partially into the conductive structure. At least some regions of the partition pass through the semiconductor-containing material and into the metal-containing material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an integrated assembly, comprising:
   forming a stack of alternating first and second materials over a conductive structure; the conductive structure comprising a semiconductor-containing material over a metal-containing material;
   forming an opening to extend through the stack and through the semiconductor-containing material to expose the metal-containing material;
   doping the semiconductor-containing material with carbon and/or with one or more metals;
   after the doping of the semiconductor-containing material, removing the second material of the stack to form voids;
   forming conductive material within the voids; and
   forming insulative material within the opening.

2. The method of claim 1 further comprising forming an insulative panel to extend through the stack and to contact the conductive material; the insulative panel being between a first NAND memory device sub-block and a second NAND memory device sub-block.

3. The method of claim 1 wherein the doping of the semiconductor-containing material is conducted prior to the forming of the stack of alternating first and second materials over the conductive structure.

4. The method of claim 1 wherein the doping of the semiconductor-containing material is conducted after the forming of the opening.

5. The method of claim 1 wherein the doping of the semiconductor-containing material comprises doping the semiconductor-containing material with the carbon.

6. The method of claim 5 wherein the doping with the carbon provides the carbon in the semiconductor-containing material to a concentration of at least about $10^{10}$ atoms/cm$^3$.

7. The method of claim 5 wherein the doping with the carbon provides the carbon in the semiconductor-containing material to a concentration of at least about $10^{18}$ atoms/cm$^3$.

8. The method of claim 5 wherein the doping with the carbon provides the carbon in the semiconductor-containing material to a concentration of at least about $10^{22}$ atoms/cm$^3$.

9. The method of claim 5 wherein the doping comprises an ion implant of the carbon into the semiconductor-containing material.

10. The method of claim 9 wherein the ion implant utilizes a plasma.

11. The method of claim 1 wherein the doping of the semiconductor-containing material comprises doping the semiconductor-containing material with the one or more metals.

12. The method of claim 11 wherein said one or more metals are selected from the group consisting of cobalt, molybdenum, nickel, ruthenium, tantalum, titanium and tungsten.

13. The method of claim 1 wherein the doping of the semiconductor-containing material comprises doping the semiconductor-containing material with both the carbon and with the one or more metals.

14. The method of claim 1 wherein the metal-containing material comprises one or more of titanium, tungsten, cobalt, nickel and molybdenum.

15. The method of claim 1 wherein the metal-containing material comprises one or more of metal silicide, metal germanide, metal carbide, metal nitride, metal oxide and metal boride.

16. The method of claim 1 wherein the semiconductor-containing material comprises one or both of silicon and germanium.

17. The method of claim 1 wherein the second material comprises silicon nitride, and wherein the removing of the second material uses phosphoric acid.

18. A method of forming an integrated assembly, comprising:
   forming a stack of alternating first and second materials over a conductive structure; the conductive structure comprising a semiconductor-containing material over a metal-containing material;
   forming a trench to extend through the stack; at least some regions of the trench passing through the semiconductor-containing material to expose regions of the metal-containing material and to expose regions of the semiconductor-containing material proximate the exposed regions of the metal-containing material;
   implanting dopant into the exposed regions of the semiconductor-containing material; the implanted dopant comprising carbon and/or one or more metals;
   removing the second material of the stack to form voids;
   forming conductive material within the voids to form conductive regions of conductive levels of a memory device; and
   forming an insulative partition within the trench; the insulative partition dividing the memory device into sub-blocks.

19. The method of claim 18 wherein the dopant comprises the carbon.

20. The method of claim 18 wherein the dopant comprises the one or more metals.

21. The method of claim 20 wherein said one or more metals are selected from the group consisting of cobalt, molybdenum, nickel, ruthenium, tantalum, titanium and tungsten.

22. The method of claim 18 wherein the first material comprises silicon oxide, and wherein the second material comprises silicon nitride.

23. The method of claim 22 wherein the removing of the second material uses phosphoric acid.

24. The method of claim 18 wherein the semiconductor-containing material comprises one or both of silicon and germanium.

25. The method of claim 18 wherein the semiconductor-containing material consists essentially of conductively-doped silicon prior to the implant of the dopant.

26. The method of claim 18 wherein the semiconductor-containing material consists essentially of conductively-doped germanium prior to the implant of the dopant.

27. The method of claim 18 wherein the semiconductor-containing material consists essentially of conductively-doped Si/Ge prior to the implant of the dopant, where Si/Ge indicates a combination of silicon and germanium.

28. An integrated assembly, comprising:
a conductive structure comprising a semiconductor-containing material over a metal-containing material; the semiconductor-containing material comprising carbon therein to a concentration of at least about $10^{10}$ atoms/cm$^3$;
a stack of alternating conductive levels and insulative levels over the conductive structure; and
a partition extending through the stack and partially into the conductive structure, at least some regions of the partition passing through the semiconductor-containing material and into the metal-containing material.

29. The integrated assembly of claim 28 wherein the carbon is uniformly distributed throughout an entirety of the semiconductor-containing material.

30. The integrated assembly of claim 28 wherein the carbon is not uniformly distributed throughout an entirety of the semiconductor-containing material, and is instead primarily within regions of the semiconductor-containing material proximate the partition.

31. The integrated assembly of claim 28 wherein the semiconductor-containing material further comprises one or more metals therein; with a total concentration of said one or more metals being less than or equal to about $10^{23}$ atoms/cm$^3$.

32. The integrated assembly of claim 28 wherein the concentration of the carbon is at least about $10^{18}$ atoms/cm$^3$.

33. The integrated assembly of claim 28 wherein the concentration of the carbon is at least about $10^{22}$ atoms/cm$^3$.

34. The integrated assembly of claim 28 wherein the semiconductor-containing material comprises one or both of silicon and germanium.

35. The integrated assembly of claim 34 wherein the semiconductor-containing material comprises one or more conductivity-enhancing dopants therein; said conductivity-enhancing dopants being selected from the group consisting of phosphorus, boron and arsenic; a total concentration of said one or more conductivity-enhancing dopants within the semiconductor-containing material being at least about $10^{22}$ atoms/cm$^3$.

36. The integrated assembly of claim 28 wherein at least some of the conductive levels of the stack are control gate levels of a memory device.

37. The integrated assembly of claim 36 wherein the partition divides the memory device into sub-blocks.

38. The integrated assembly of claim 28 wherein the insulative levels of the stack comprise silicon dioxide.

39. The integrated assembly of claim 28 wherein the partition comprises silicon dioxide.

* * * * *